US012742990B2

(12) United States Patent
Blackmer et al.

(10) Patent No.: US 12,742,990 B2
(45) Date of Patent: Sep. 22, 2026

(54) LAYERED SUBSTRATE WITH REDUCED BLUE DOT DEFECT DENSITY

(71) Applicant: SAGE Electrochromics, Inc., Faribault, MN (US)

(72) Inventors: Nicholas John Blackmer, Medford, MN (US); Scott David Knapp, Lonsdale, MN (US); Joshua Schrot, Faribault, MN (US); Yan Wang, Lakeville, MN (US)

(73) Assignee: SAGE Electrochromics, Inc., Faribault, MN (US)

( * ) Notice: Subject to any disclaimer, the term of this patent is extended or adjusted under 35 U.S.C. 154(b) by 182 days.

(21) Appl. No.: 18/735,055

(22) Filed: Jun. 5, 2024

(65) Prior Publication Data

US 2024/0411192 A1 Dec. 12, 2024

Related U.S. Application Data

(60) Provisional application No. 63/507,387, filed on Jun. 9, 2023.

(51) Int. Cl.
*G02F 1/153* (2006.01)
*C23C 14/00* (2006.01)
(Continued)

(52) U.S. Cl.
CPC ........ *G02F 1/1533* (2013.01); *C23C 14/0084* (2013.01); *C23C 14/08* (2013.01);
(Continued)

(58) Field of Classification Search
CPC .... G02F 1/13439; G02F 1/1524; G02F 1/153; G02F 1/1533; G02F 1/155; G02F 1/163;
(Continued)

(56) References Cited

U.S. PATENT DOCUMENTS

| | | | |
|---|---|---|---|
| 9,638,977 | B2 | 5/2017 | Friedman et al. |
| 2013/0182307 | A1 | 7/2013 | Gillaspie et al. |

(Continued)

FOREIGN PATENT DOCUMENTS

| | | |
|---|---|---|
| EP | 3410183 | 5/2018 |
| WO | 2016/085823 | 6/2016 |

OTHER PUBLICATIONS

International Search Report and Written Opinion Mailed Sep. 30, 2024 in PCT/US2024/032965, Sage Electrochromics, Inc., pp. 1-10.

*Primary Examiner* — Jack Dinh
(74) *Attorney, Agent, or Firm* — Robert C. Kowert; Kowert, Hood, Munyon, Rankin & Goetzel, P.C.

(57) ABSTRACT

An electrochromic (EC) device includes a substrate and a plurality of layers formed on the substrate. The plurality of layers includes an active layer that is lithiated for changing a tint of the EC device. The active layer is lithiated using a deposition process that uses one or more lithium (Li) targets. The deposition process provides, on no more than 1.5% of manufactured EC devices, a Li tungsten-oxide deposit area on the substrate that is over-concentrated with Li relative to a surrounding area on the substrate. In some aspects, the EC device may be a component of an EC system that further includes a power supply electrically connected to the EC device and configured to provide a voltage to the EC device for controlling a tint of the EC device.

20 Claims, 11 Drawing Sheets

(51) Int. Cl.

| | |
|---|---|
| ***C23C 14/08*** | (2006.01) |
| ***C23C 14/34*** | (2006.01) |
| ***G02F 1/1343*** | (2006.01) |
| ***G02F 1/155*** | (2006.01) |
| ***G02F 1/163*** | (2006.01) |

(52) U.S. Cl.
CPC ...... *C23C 14/3464* (2013.01); *G02F 1/13439* (2013.01); *G02F 1/155* (2013.01); *G02F 1/163* (2013.01); *G02F 2001/1555* (2013.01)

(58) Field of Classification Search
CPC ......... G02F 2001/1555; C23C 14/0084; C23C 14/08; C23C 14/3414; C23C 14/3464; C23C 14/564
See application file for complete search history.

(56) References Cited

U.S. PATENT DOCUMENTS

| | | | |
|---|---|---|---|
| 2020/0379310 | A1 | 12/2020 | Rozbicki et al. |
| 2021/0103195 | A1 | 4/2021 | Kailasam et al. |
| 2021/0247654 | A1 | 8/2021 | Mogensen |
| 2023/0144179 | A1 | 5/2023 | Wang et al. |

Mesh Shield
902

Ridged Shield
904

LAYERED SUBSTRATE WITH REDUCED BLUE DOT DEFECT DENSITY

PRIORITY APPLICATION

This application claims benefit of priority to U.S. Provisional Application Ser. No. 63/507,387, entitled "Layered Substrate with Reduced Blue Dot Defect Density," filed Jun. 9, 2023, and which is hereby incorporated herein by reference in its entirety.

FIELD OF THE DISCLOSURE

The present disclosure is directed to one or more smart glass units, and more specifically to various approaches for manufacturing one or more smart glass units.

BACKGROUND

Smart glass may be used to decrease heat transfer through a window and/or reduce the transmission of visible light to provide tinting or shading. A smart glass system including a smart glass (e.g., an electrochromic (EC) device, an electrochromic insulated glass unit (EC-IGU), a device with a glass that changes, for example tint, in response to an input, an electrical charge, and/or the environment) may be used to provide a decrease in solar heat gain (e.g., increase in insulation) through a transparent substrate and a reduction in visible light transmission through a transparent substrate (e.g., a window or glass pane). An EC device may include EC materials that are known to change their optical properties, such as coloration, in response to the application of an electrical potential, thereby making the transparent substrate more or less transparent or more or less reflective. An EC device can also change its optical properties such as optical transmission, absorption, reflectance and/or emittance in a continual but reversible manner on application of voltage. These properties enable the EC device to be used for applications like smart glasses, EC mirrors, EC display devices, and the like. EC glass may include a type of glass or glazing for which light transmission properties of the glass or glazing are altered when electrical power (e.g., voltage/current) is applied to the glass. EC materials may change in opacity (e.g., may changes levels of tinting) when electrical power is applied. During EC device manufacturing, some manufactured EC devices are produced having visual defects (e.g., blue dots or blue areas) that locally affect the EC device's ability to change tint. In some cases, the EC devices are produced having a multitude of visual defects. In other cases, the EC devices are produced having only one or two visual defects. In either case. EC devices having such visual defects render those EC device unsuitable for the end customers.

SUMMARY

In some aspects, an electrochromic (EC) device is provided. The EC device includes a substrate. The EC device also includes a plurality of layers formed on the substrate. The plurality of layers includes an active layer (or multiple active layers) that is lithiated for changing a tint of the EC device. The active layer is lithiated using a deposition process that uses one or more lithium (Li) targets. The deposition process provides a Li tungsten-oxide deposit area on the substrate that is over-concentrated with Li relative to at least one other remaining area (e.g., a surrounding area) on the substrate and on no more than 1.50% of manufactured EC devices. In some aspects, the EC device may be a component of an EC system that further includes a power supply electrically connected to the EC device and configured to provide a voltage to the EC device for controlling a tint of the EC device.

In some aspects, an electrochromic (EC) device is provided. The EC device includes a substrate. The EC device also includes a plurality of layers formed on the substrate. The plurality of layers includes an active layer (or multiple active layers) that is lithiated for changing a tint of the EC device. The active layer is lithiated using a deposition process that uses one or more lithium (Li) targets. The deposition process that uses the one or more Li targets provides a Li tungsten-oxide deposit area on the substrate that is visually inconsistent relative to at least one other remaining area on the substrate on no more than 1.50% of manufactured EC devices. In some aspects, the EC device may be a component of an EC system that further includes a power supply electrically connected to the EC device and configured to provide a voltage to the EC device for controlling a tint of the EC device.

In some aspects, a method of manufacturing a layered substrate for electrochromic (EC) devices is provided. The method includes that a plurality of respective substrates are received by a chamber. The plurality of respective substrates includes respective sets of layers positioned thereon. A respective active layer(s) of the respective sets of layers is lithiated for changing a tint of the respective EC devices. The method also includes that the respective active layer(s) of the respective sets of layers are lithiated in the chamber using a deposition process that uses one or more lithium (Li) targets. When the respective active layer(s) are lithiated in the chamber, Li from the one or more Li targets is deposited onto a surface of one or more interior walls of the chamber. The method further includes that at least some Li from the surface of the one or more interior walls of the chamber is removed. In some aspects, all or substantially all of the Li from the surface of the one or more interior walls of the chamber is removed. In addition, the method includes that subsequent substrates are received by the chamber. The subsequent substrates include respective subsequent sets of layers positioned on the respective subsequent substrates and including a respective subsequent active layer(s). The method also includes that the respective subsequent active layers of the respective subsequent sets of layers are lithiated using the deposition process after removing at least some of the Li from the surface of the one or more interior walls of the chamber. No more than 1.50% of the respective subsequent sets of layers positioned on the respective subsequent substrates includes a respective subsequent active layer(s) having a Li tungsten-oxide deposit area that is over-concentrated with Li relative to at least one other remaining area of the respective subsequent active layer(s).

Figure 1:
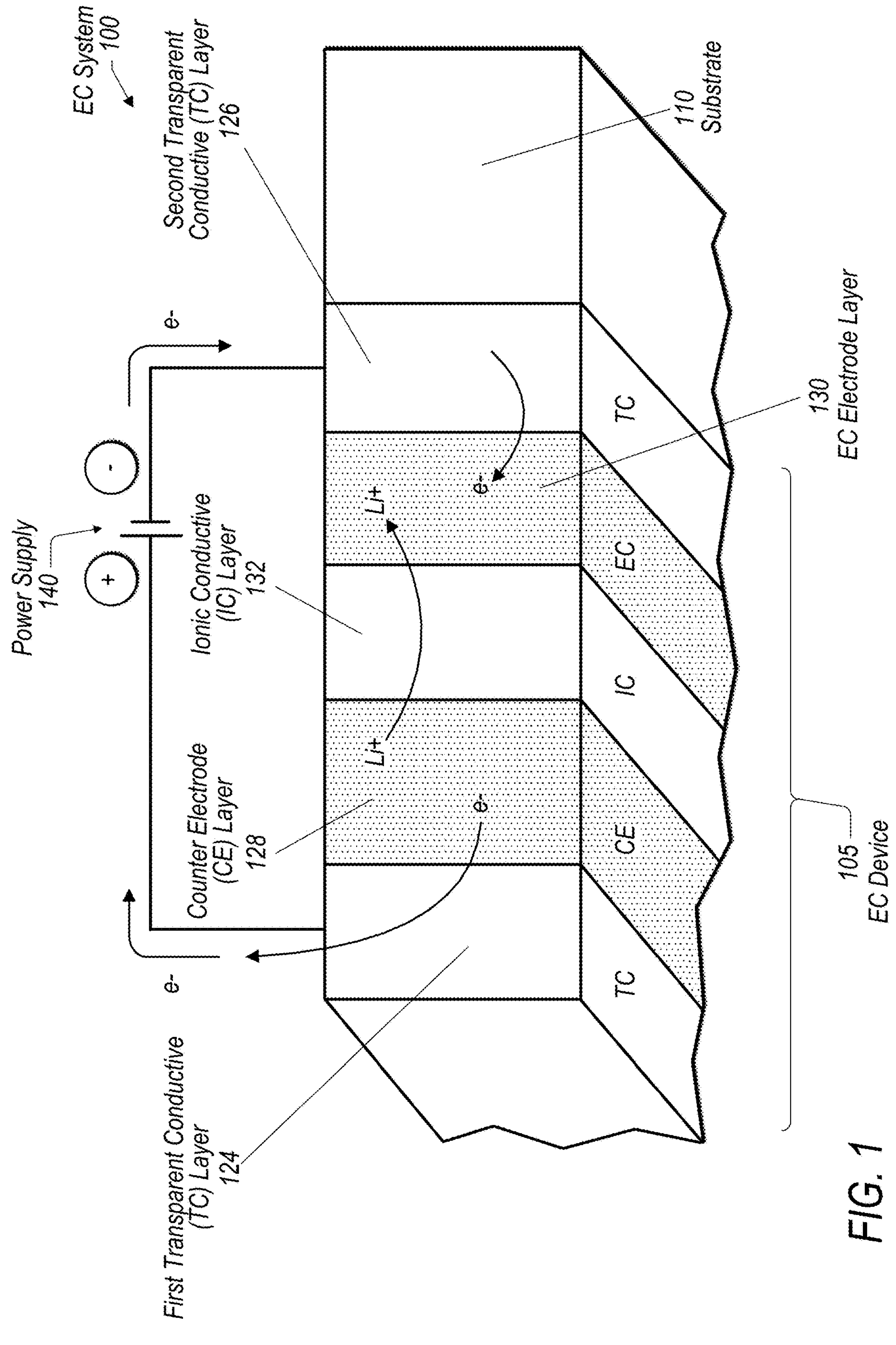
FIG. 1 illustrates a perspective view of an example EC system according to some aspects of this disclosure.

This specification may include references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . " Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value. It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will further be understood that the term "or" as used herein refers to and encompasses alternative combinations as well as any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. For example, the words "include," "including," and "includes" indicate open-ended relationships and therefore mean including, but not limited to. Similarly, the words "have," "having," and "has" also indicate open-ended relationships, and thus mean having, but not limited to.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Whenever a relative term, such as "about", "substantially" or "approximately", is used in this specification, such a term should also be construed to also include the exact term. That is, e.g., "substantially straight" should be construed to also include "(exactly) straight". As used herein, the terms "about", "substantially", or "approximately" (and other relative terms) may be interpreted in light of the specification and/or by those having ordinary skill in the art. In some examples, such terms may as much as 1%, 3%, 5%, 7%, or 10% different from the respective exact term.

While embodiments are described herein by way of example for several embodiments and illustrative drawings, those skilled in the art will recognize that the embodiments are not limited to the embodiments or drawings described. It should be understood that the drawings and detailed description thereto are not intended to limit embodiments to the particular form disclosed, but on the contrary, the intention is to cover all modifications, equivalents and alternatives falling within the spirit and scope as defined by the appended claims. Any headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must).

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Smart glass may be used to decrease heat transfer through a window and/or reduce the transmission of visible light to provide tinting or shading. A smart glass system including a smart glass (e.g., an electrochromic (EC) device, an electrochromic insulated glass unit (EC-IGU), a device with a glass that changes, for example tint, in response to an input, an electrical charge, and/or the environment) may be used to provide a decrease in solar heat gain (e.g., increase in insulation) through a transparent substrate and a reduction in visible light transmission through a transparent substrate (e.g., a window or glass pane). An EC device may include EC materials that are known to change their optical properties, such as coloration, in response to the application of an electrical potential, thereby making the transparent substrate more or less transparent or more or less reflective. An EC device can also change its optical properties such as optical transmission, absorption, reflectance and/or emittance in a continual but reversible manner on application of voltage. These properties enable the EC device to be used for applications like smart glasses, EC mirrors, EC display devices, and the like. EC glass may include a type of glass or glazing for which light transmission properties of the glass or glazing are altered when electrical power (e.g., voltage/current) is applied to the glass. EC materials may change in opacity (e.g., may changes levels of tinting) when electrical power is applied. During EC device manufacturing, some manufactured EC devices are produced having visual defects (e.g., blue dots, blue areas, discolored dots, discolored areas) that locally affect (e.g., at the area of the defect) the EC device's ability to change tint. In some cases, the EC devices are produced having a multitude of visual defects. In other cases, the EC devices are produced having only one or two visual defects. In either case, EC devices having such visual defects may require additional manufacturing steps to repair the defects or may render those EC devices unsuitable for the end use.

EC device manufacturers produce a multitude of EC devices, many of which contain visual defects. When the visual defects are small enough and/or few enough on a single EC device, these visual defects may be removed through additional manufacturing steps costing additional time and resources to produce a product suitable for end use. When the visual defects are large enough and/or many on a single EC device, that single EC device may be deemed unsuitable for end use and disposed of wasting manufacturing time and resources. In many cases, EC device manufacturers deem many manufactured EC devices unsuitable for end use and are left to throw those EC devices away. As described herein, a plurality or a multitude of EC devices may be manufactured using a manufacturing process so that no more than 1.50% of manufactured EC devices include a visual defect. In some aspects, a plurality or a multitude of EC devices may be manufactured using a manufacturing process so that no manufactured EC devices include a visual defect. For example, thousands, tens of thousands, or hundreds of thousands of EC devices may be manufactured using the manufacturing processes described herein so that 1.50% or less of those manufactured EC devices (e.g., none of those manufactured EC devices) include a visual defect. In some aspects, a plurality or a multitude of layered substrates may be subsequently manufactured using a manufacturing process that uses the one or more Li targets to provide a Li deposit area (e.g., a Li tungsten-oxide deposit area) on the layered substrate that is visually inconsistent relative to at least one other remaining area (e.g., a surrounding area) on the layered substrate on no more than 1.50% of manufactured EC devices.

FIG. 1 illustrates a perspective view of an example EC system 100 according to some aspects of this disclosure. The EC system 100 may include one or more same or similar features as the features described with respect to or illustrated in FIGS. 2, 3, 4, 5, 6, 7A-7B, 8A-8B, and 9. For example, the EC system 100 may include and/or be manufactured using one or more same or similar features as the features described with respect to the method 200 described with respect to FIG. 2, the method 600 described with respect to FIG. 6, the method 700 described with respect to FIGS. 7A-7B and/or the method 800 described with respect to FIGS. 8A-8B. The EC system 100 may include one or more same or similar features as the features described with respect FIGS. 3, 4, 5, and 9. FIG. 1, as with the other included figures, is shown for illustrative purposes and does not limit either the possible embodiments of the present invention or the claims.

In this example, the EC system 100 may include an EC device 105 secured to a substrate 110. The EC device 105 may be a non-limiting example of a smart glass or smart glass unit as provided herein. The EC device 105 may include a thin film which may be deposited on to the substrate 110. The EC device 105 may include a first transparent conductive (TC) layer 124 and a second TC layer 126 in contact with the substrate 110. In some aspects, the first TC layer 124 and the second TC layer 126 may be, or may include, one or more transparent conductive oxide (TCO) layers. The substrate 110 may include one or more optically transparent materials, e.g., glass, plastic, and the like. The EC device 105 may also include one or more active layers. For example, the EC device 105 may include a counter electrode (CE) layer 128 in contact with the first TC layer 124 and an EC electrode layer 130 in contact with the second TC layer 126. An ionic conductor (IC) layer 132 may be positioned in-between (e.g., "sandwiched" between) the CE layer 128 and the EC electrode layer 130. The EC system 100 may include a power supply 140 which may provide regulated current or voltage to the EC device 105. Transparency of the EC device 105 may be controlled by regulating density of charges (or lithium ions) in the CE layer 128 and/or the EC electrode layer 130 of the EC device 105. For instance, when the EC system 100 applies a positive voltage from the power supply 140 to the first TC layer 124, lithium ions may be inserted into the EC electrode layer 130. In some aspects, when the EC system 100 applies a positive voltage from the power supply 140 to the first TC layer 124, lithium ions may be driven across the IC layer 132 and inserted into the EC electrode layer 130. Simultaneously, charge-compensating electrons may be extracted from the CE layer 128, may flow across the external circuit, and may flow into the EC electrode layer 130. Transfer of lithium ions and associated electrons from the CE layer 128 to the EC electrode layer 130 may cause the EC device 105 to become darker—e.g., the visible light transmission of the EC device

105 may decrease. Reversing the voltage polarity may cause the lithium ions and associated charges to return to their original layer, the CE layer 128, and as a result, the EC device 105 may return to a clear state—e.g., the visible light transmission of the EC device 105 may increase.

As described herein, a smart glass or device such as the EC device 105 of FIG. 1 may receive a charge (e.g., a voltage) for controlling a tint of the smart glass. For example, an electrical charge may be provided to a smart glass to increase a level of tint (e.g., darken) of the smart glass. As another example, an electrical charge may be provided to a smart glass to maintain a level of tint of the smart glass. As yet another example, an electrical charge may be provided to a smart glass to decrease a level of tint of the smart glass. As another example, an electrical charge may be provided to a smart glass to clear a tint of the smart glass.

During manufacturing of an EC device 105 for an EC system 100, for example, a layered substrate may be inserted into a chamber (e.g., a vacuum chamber) for a deposition process. For example, the layered substrate may include a plurality of layers positioned on a substrate (e.g., the substrate 110 illustrated in FIG. 1). The plurality of layers may include a first transparent conductive layer (e.g., first TC layer 124 illustrated in FIG. 1), a counter electrode (CE) layer (e.g., CE layer 128 illustrated in FIG. 1), an EC electrode layer (e.g., EC electrode layer 130 illustrated in FIG. 1), and/or a second TC layer (e.g., second TC layer 126 illustrated in FIG. 1). One or more targets (e.g., lithium (Li) targets) positioned within chamber may be used in a deposition process for lithiating Li (e.g., sputtering Li) onto a surface of at least one layer of the layered substrate and/or into at least one layer of the layered substrate. In some aspects, the one or more targets may be used to lithiate Li onto a surface of at least one active layer of the plurality of layers and/or into at least one active layer of the plurality of layers. For example, when the target(s) receive electrical power, the targets may lithiate Li onto a surface of at least one active layer of the plurality of layers and/or into at least one active layer of the plurality of layers. In some aspects, an active layer may be a counter electrode (CE) layer (e.g., CE layer 128 illustrated in FIG. 1) and/or an EC electrode layer (e.g., EC electrode layer 130 illustrated in FIG. 1). In some aspects, the target(s) may include at least one cylindrical target and/or at least one planar target. As described herein, lithiating Li onto a surface of at least one layer of the layered substrate and/or into at least one layer of the layered substrate may be used for changing a tint of the EC device when receiving electrical power.

When the target(s) lithiate Li onto and/or into at least one layer of the plurality of layers of the layered substrate, Li is also deposited, as a result of the deposition process, onto surfaces forming the interior walls of the chamber. For example, in addition to Li depositing onto and/or into an active layer of the plurality of layers of the layered substrate, Li is also deposited onto one or more side walls forming the interior sides of the chamber and/or on a top wall forming an interior ceiling of the chamber. As lithium builds on surfaces forming the interior walls of the chamber, portions of that lithium can fall off (e.g., slough off, flake off) those interior surfaces and fall back on the targets and/or the layered substrate. Portions of the lithium that fall off the interior surfaces and onto the layered substrate may contaminate the layered substrate and create visual defects at the locations of the layered substrate that receive those lithium portions from the interior surfaces. Also, portions of the lithium that fall off the interior surfaces of the chamber and onto the target(s) contaminating the target(s) may create visual defects on the layered substrate when lithium from the area(s) of the target(s) that received those lithium portions lithiate onto and/or into a layer of the layered substrate.

Accordingly, to prevent lithium from creating visual defects on the layered substrate, at least some lithium may be removed from the interior walls of the chamber to prevent portions of the lithium from falling off the interior walls of the chamber and onto the layered substrate contaminating the layered substrate and/or from falling off the interior walls of the chamber and onto the targets. For example, at least some lithium may be removed from the interior walls of the chamber after a predetermined amount of time or after a predetermined number of layered substrates have been lithiated. The predetermined amount of time and/or the predetermined number of layered substrates that have been lithiated may be calculated to predict a maximum or acceptable amount of lithium forming on the interior surfaces of the chamber without portions of lithium separating from the interior walls and contaminating the layered substrate and/or the target(s). In some aspects, only some lithium may be removed from the interior surfaces of the chamber so as to prevent lithium from separating from the interior walls and contaminating the layered substrate and/or the target(s) for a predetermined amount of time and/or for a predetermined number of layered substrates that have been lithiated. Removing only some of the lithium forming on the interior walls of the chamber may prevent contamination of the layered substrate and/or the targets and prevent visual defects from forming on the layered substrate while maintaining a high EC device manufacturing rate. For example, removing only some (e.g., a predetermined adequate amount) of the lithium from the interior walls of the chamber may utilize a minimal amount of time to maintain a high EC device manufacturing rate. In some aspects, all or substantially all of the lithium may be removed from the interior surfaces of the chamber so as to prevent lithium from separating from the interior walls and contaminating the layered substrate and/or the target(s) for a predetermined amount of time and/or for a predetermined number of layered substrates that have been lithiated. For example, removing all or substantially all of the lithium from the interior walls of the chamber may extend the amount of time or the number of layered substrates that are lithiated before lithium from the interior walls of the chamber need subsequent lithium removal. Removing at least some lithium from the interior walls of the chamber may facilitate manufacturing hundreds, thousands, tens of thousands, and/or hundreds of thousands of EC devices so that 1.50% or less of those manufactured EC devices (e.g., none of those manufactured EC devices) include a visual defect.

Lithium may be removed from the interior walls of the chamber using a variety of different techniques. For example, lithium may be scraped and/or brushed off the interior walls of the chamber between lithiating layered substrates. In some aspects, the interior walls of the chamber may be hosed down with water under high pressure and/or sand blasted to remove lithium therefrom. Additionally, or alternatively, the interior walls of the chamber may be cleaned (e.g., using one or more chemical cleaners) to remove lithium from the interior walls. In some aspects, the interior walls of the chamber may include shields positioned over the interior walls of the chamber. The shields may include one or more ridges or shelves (e.g., ridged shield 904 illustrated in FIG. 9) to catch and retain lithium thereby preventing lithium from falling off and contaminating the layered substrate and/or the target(s). In some aspects, the shields may include a mesh structure or textured structure (e.g., mesh shield 902 illustrated in FIG. 9) to catch and retain lithium thereon. In some aspects, the shields may be removeable and reusable. For example, after the shields catch and retain lithium lithiated from the target(s), the shields may be removed from the chamber where the lithium retained on the shields is removed. Subsequently, the shields may be reinserted into the chamber for lithiating subsequent layered substrates. In some aspects, the shields may be removable and disposable. For example, after the shields catch and retain lithium lithiated from the target(s), the shields may be removed from the chamber and subsequently replaced with new shields for reinsertion into the chamber for lithiating subsequent layered substrates.

It should be understood that the shields, as described herein, may be an included component of the chamber. For example, the shields may be provided with the chamber when the chamber is purchased for use. In some aspects, the shields may be an added component of the chamber. For example, the chamber may not come with shields and the shields may be added to the chamber for use as described herein. As another example, the chamber may be manufactured with a first set of shields. The first set of shields may be flat surfaced, ridged, meshed, or the like. The first set of shields may be removed and replaced with a second set of shields. The second set of shields may be different from the first set of shields. For instance, the first set of shields may be ridged and the second set of shields may be meshed. Additionally, or alternatively, the first set of shields may be flat surfaced and the second set of shields may be meshed. Additionally, or alternatively, the first set of shields may be meshed and the second set of shields may be flat surfaced or ridged.

In some aspects, to prevent lithium from creating visual defects on the layered substrate, the power source to provide power to the targets may be a bi-polar direct current (DC) power source. The bi-polar DC power source may provide instant or virtually instant power switch-on/off to allow less energy to travel through an arc travelling between the target and the layered substrate and caused by a contaminated section of the target thereby reducing or minimizing visual defects forming on the layered substrate. Using, for example, a bi-polar DC power source may at least help facilitate manufacturing hundreds, thousands, tens of thousands, and/or hundreds of thousands of EC devices so that 1.50% or less of those manufactured EC devices (e.g., none of those manufactured EC devices) include a visual defect. In some aspects, the power source may be an AC power source to provide fast (e.g., less fast) power switch-on/off to reduce energy travel through an arc travelling between the target and the layered substrate and caused by a contaminated section of the target thereby reducing or minimizing visual defects forming on the layered substrate. In some aspects, using, for example, an AC power source may at least help facilitate manufacturing hundreds, thousands, tens of thousands, and/or hundreds of thousands of EC devices so that 1.50% or less of those manufactured EC devices (e.g., none of those manufactured EC devices) include a visual defect.

In some aspects, to prevent lithium from creating visual defects on the layered substrate, the power source (e.g., power source 307 illustrated in FIG. 3) may provide power within a specified frequency range to the targets. For example, a power source may provide power to a pair of targets including a first target and a second target. The first target may be an anode and the second target may be a cathode. The frequency of the power may produce a rate at which the first target and the second target alternatively switch between being the anode and cathode. For instance, the frequency of the power may be 1.0 kHz. Thus, the first target and the second target may alternatingly switch between being the anode and the cathode one thousand (1000) times per second. In some aspects, to prevent lithium from creating visual defects on the layered substrate, the frequency range of the power may be between about 0.5 kHz and about 10.0 kHz. In some aspects, to prevent lithium from creating visual defects on the layered substrate, the frequency range of the power may be as low as about 0.1 kHz and as high as about 20.0 kHz. In some aspects, a power source may provide power to the targets at a frequency outside the frequency range (e.g., 30.0 kHz, 35.0 kHz) for lithiating on layered substrates. In response to detecting visual defects on a layered substrate, a frequency of the power may be changed (e.g., lowered) to a frequency within the frequency range (e.g., 1.0 kHz) to prevent more lithium from creating visual defects on subsequent layered substrates. In some aspects, using, for example, a frequency within the range may at least help facilitate manufacturing hundreds, thousands, tens of thousands, and/or hundreds of thousands of EC devices so that 1.50% or less of those manufactured EC devices (e.g., none of those manufactured EC devices) include a visual defect.

Figure 2:
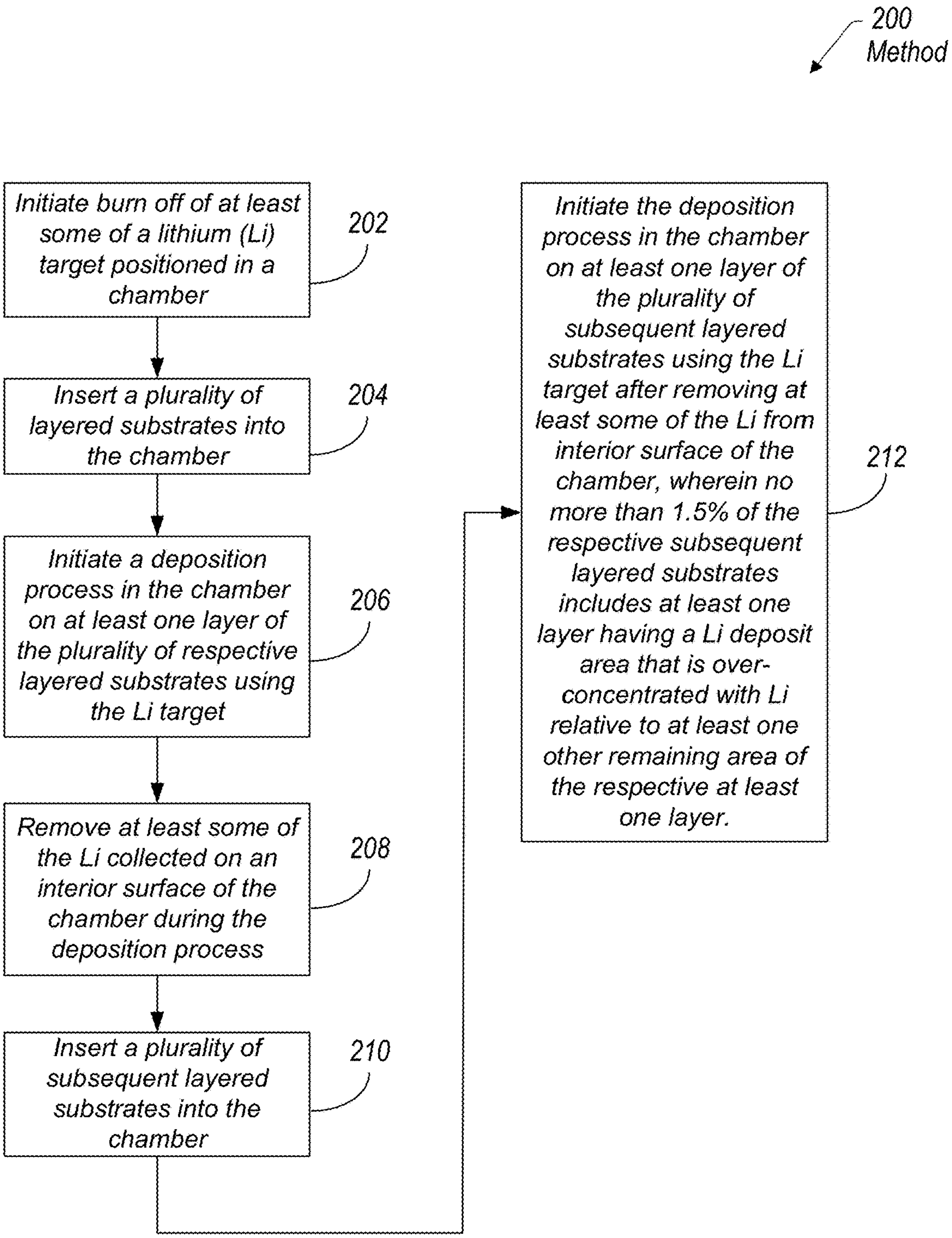
FIG. 2 illustrates a block diagram of an example method according to some aspects of this disclosure.

FIG. 2 illustrates a block diagram of an example method 200 according to some aspects of this disclosure. In some aspects, the method 200 may be implemented to manufacture the system 100 illustrated in FIG. 1 and/or the layered substrate 512 illustrated in FIG. 5. In some aspects, the method 200 may be implemented using the system 300 illustrated in FIG. 3. One or more steps and/or one or more aspects described with respect to FIG. 2 may be included with and/or include one or more steps and/or one or more aspects of the method 600 described with respect to FIG. 6, the method 700 described with respect to FIGS. 7A-7B, and/or the method 800 described with respect to FIGS. 8A-8B. FIG. 2, as with the other included figures, is shown for illustrative purposes and does not limit either the possible embodiments of the present invention or the claims.

At step 202, at least some of a lithium (Li) target (e.g., the targets 308 illustrated in FIG. 3) positioned in a chamber may be burned off. For example, one or more lithium target(s) may be positioned within a deposition chamber (e.g., chamber 302 illustrated in FIG. 3). Before lithiating lithium onto one or more layered substrates (e.g., layered substrates 312, 312*a*, and/or 312*b* illustrated in FIG. 3), power may be provided through the targets to burn off at least some the lithium targets to prepare the targets for lithiating.

At step 204, a plurality of layered substrates may be inserted on and/or positioned into the chamber, and at step 206, a deposition process may be initiated in the chamber on at least one layer of the plurality of respective layered substrates using the Li target. For example, a multitude of layered substrates may be sequentially positioned (e.g., one at a time) into the chamber. The target(s) may lithiate lithium on to each of the sequentially positioned layered substrates so that lithium collects onto a surface and/or within at least one layer of the plurality of layers of each respective layered substrates. At the same time, lithium collects on the surface(s) of the interior wall(s) of the chamber. Thus, in addition to Li depositing onto and/or into an active layer of the plurality of layers of the layered substrate, Li is also deposited onto one or more side walls forming the interior sides of the chamber and/or on a top wall forming an interior ceiling of the chamber. As lithium builds on surfaces forming the interior walls of the chamber, portions of that lithium fall off (e.g., slough off, flake off) those interior surfaces and fall back on the targets and/or the layered substrate. Portions of the lithium that fall off the interior surfaces and onto the layered substrate may contaminate the layered substrate and create visual defects at the locations of the layered substrate that receive those lithium portions from the interior surfaces. Also, portions of the lithium that fall off the interior surfaces of the chamber and onto the target(s) contaminating the target(s) may create visual defects on the layered substrate when lithium from the area(s) of the target(s) that received those lithium portions lithiate onto and/or into a layer of the layered substrate.

At step 208, at least some of the Li collected on an interior surface of the chamber during the deposition process may be removed. For example, at least some lithium may be removed from the interior walls of the chamber after a predetermined amount of time or after a predetermined number of layered substrates have been lithiated. The predetermined amount of time and/or the predetermined number of layered substrates that have been lithiated may be calculated to predict a maximum or acceptable amount of lithium forming on the interior surfaces of the chamber without portions of lithium separating from the interior walls and contaminating the layered substrate and/or the target(s). In some aspects, only some lithium may be removed from the interior surfaces of the chamber so as to prevent lithium from separating from the interior walls and contaminating the layered substrate and/or the target(s) for a predetermined amount of time and/or for a predetermined number of layered substrates that have been lithiated. Removing only some of the lithium forming on the interior walls of the chamber may prevent contamination of the layered substrate and/or the targets and prevent visual defects from forming on the layered substrate while maintaining a high EC device manufacturing rate. For example, removing only some (e.g., a predetermined adequate amount) of the lithium from the interior walls of the chamber may utilize a minimal amount of time to maintain a high EC device manufacturing rate. In some aspects, all or substantially all of the lithium may be removed from the interior surfaces of the chamber so as to prevent lithium from separating from the interior walls and contaminating the layered substrate and/or the target(s) for a predetermined amount of time and/or for a predetermined number of layered substrates that have been lithiated. For example, removing all or substantially all of the lithium from the interior walls of the chamber may extend the amount of time or the number of layered substrates that are lithiated before lithium from the interior walls of the chamber need subsequent lithium removal. Removing at least some lithium from the interior walls of the chamber may facilitate manufacturing hundreds, thousands, tens of thousands, and/or hundreds of thousands of EC devices so that 1.50% or less of those manufactured EC devices (e.g., none of those manufactured EC devices) include a visual defect.

Lithium may be removed from the interior walls of the chamber using a variety of different techniques. For example, lithium may be scraped and/or brushed off the interior walls of the chamber between lithiating layered substrates. In some aspects, the interior walls of the chamber may be hosed down with water under high pressure and/or sand blasted to remove lithium therefrom. Additionally, or alternatively, the interior walls of the chamber may be cleaned (e.g., using one or more chemical cleaners) to remove lithium from the interior walls. In some aspects, the interior walls of the chamber may include shields positioned over the interior walls of the chamber. The shields may include one or more ridges or shelves (e.g., ridged shield 904 illustrated in FIG. 9) to catch and retain lithium thereby preventing lithium from falling off and contaminating the layered substrate and/or the target(s). In some aspects, the shields may include a mesh structure or textured structure (e.g., mesh shield 902 illustrated in FIG. 9) to catch and retain lithium thereon. In some aspects, the shields may be removeable and reusable. For example, after the shields catch and retain lithium lithiated from the target(s), the shields may be removed from the chamber where the lithium retained on the shields is removed. Subsequently, the shields may be reinserted into the chamber for lithiating subsequent layered substrates. In some aspects, the shields may be removable and disposable. For example, after the shields catch and retain lithium lithiated from the target(s), the shields may be removed from the chamber and subsequently replaced with new shields for reinsertion into the chamber for lithiating subsequent layered substrates.

At step 210, a plurality of subsequent layered substrates may be inserted into the chamber, and at step 212, the deposition process may be initiated in the chamber on at least one layer of the plurality of subsequent layered substrates using the Li target after removing at least some of the Li from interior surface of the chamber. For example, after at least some lithium is removed from the interior walls of the chamber, a plurality of subsequent layered substrates may be inserted on and/or positioned into the chamber, and a deposition process may be initiated in the chamber on at least one layer of the plurality of respective subsequent layered substrates using the Li target. For example, a multitude of subsequent layered substrates may be sequentially positioned (e.g., one at a time) into the chamber. The target(s) may lithiate lithium on to each of the subsequent sequentially positioned layered substrates so that lithium collects onto a surface and/or within at least one layer of the plurality of layers of each respective layered substrates. As a result of this process, a multitude of layered substrates are produced so that no more than 1.5% of the respective subsequent layered substrates include at least one layer having a Li deposit area that is over-concentrated with Li relative to at least one other remaining area (e.g., a surrounding area) of the respective at least one layer. In some aspects, a plurality or a multitude of layered substrates may be subsequently manufactured using a manufacturing process that uses the one or more Li targets to provide a Li tungsten-oxide deposit area on the layered substrate that is visually inconsistent relative to at least one other remaining area on the layered substrate on no more than 1.50% of manufactured EC devices.

It should be understood that the manufacturing process described herein allows for a plurality or multitude of EC devices to be manufactured (e.g., thousands, tens of thousands, hundreds of thousands) while maintaining no more than a minimal quantity of EC devices that contain a visual defect. For example, before lithium builds on surfaces forming the interior walls of the chamber so that portions of that lithium fall off (e.g., slough off, flake off) those interior surfaces and fall back on the targets and/or the layered substrate as described herein, the manufacturing process may produce no more than a minimal quantity of EC devices that include a visual defect (e.g., no more than 1.5% of those manufactured EC device have a visual defect, none of those manufactured EC device have a visual defect). Upon removing at least some of the lithium from the surface forming the interior walls of the chamber, and subsequently initiating the deposition process on the subsequent layered substrates as also described herein, the manufacturing process may continue to produce no more than the minimal quantity of EC devices that include a visual defect (e.g., no more than 1.5% of those manufactured EC device have a visual defect, none of those manufactured EC device have a visual defect). Thus, the manufacturing process avoids unwanted disruption and/or additional time and expense in manufacturing and/or the supply chain to dispose of and/or repair a larger number of EC devices that contain a visual defect as a result of lithium buildup on surfaces forming the interior of the chamber and lithium contamination of the targets and/or layered substrates.

In some aspects, to prevent lithium from creating visual defects on the layered substrate, the power source (e.g., power source 307 illustrated in FIG. 3) may provide power within a specified frequency range to the targets. For example, a power source may provide power to a pair of targets including a first target and a second target. The first target may be an anode and the second target may be a cathode. The frequency of the power may produce a rate at which the first target and the second target alternatively switch between being the anode and cathode. For instance, the frequency of the power may be 1.0 kHz. Thus, the first target and the second target may alternatingly switch between being the anode and the cathode one thousand (1000) times per second. In some aspects, to prevent lithium from creating visual defects on the layered substrate, the frequency range of the power may be between about 0.5 kHz and about 10.0 kHz. In some aspects, to prevent lithium from creating visual defects on the layered substrate, the frequency range of the power may be as low as about 0.1 kHz and as high as about 20.0 kHz. In some aspects, a power source may provide power to the targets at a frequency outside the frequency range (e.g., 30.0 kHz, 35.0 kHz) for lithiating on layered substrates, for example, at step 206. In response to detecting visual defects on a layered substrate, at step 212, a frequency of the power may be changed (e.g., lowered) to a frequency within the frequency range (e.g., 1.0 kHz) to prevent more lithium from creating visual defects on subsequent layered substrates. In some aspects, to prevent lithium from creating visual defects on the layered substrate, the frequency may be changed to a frequency that is within the frequency range without using one or more of the different techniques described herein to remove lithium from chamber as described with respect to step 208. In some aspects, to prevent lithium from creating visual defects on the layered substrate, the frequency may be changed to a frequency that is within the frequency range in addition to using one or more of the different techniques described herein to remove lithium from chamber as described with respect to step 208. In some aspects, using, for example, a frequency within the range may at least help facilitate manufacturing hundreds, thousands, tens of thousands, and/or hundreds of thousands of EC devices so that 1.50% or less of those manufactured EC devices (e.g., none of those manufactured EC devices) include a visual defect.

Please note that the functional block(s) described herein are illustrated in FIG. 2 in merely one example arrangement. In other embodiments, the techniques and functionality described above may be performed using different steps in different orders or may be grouped into a different number of steps or may be performed as a single method without distinct steps.

Figure 3:
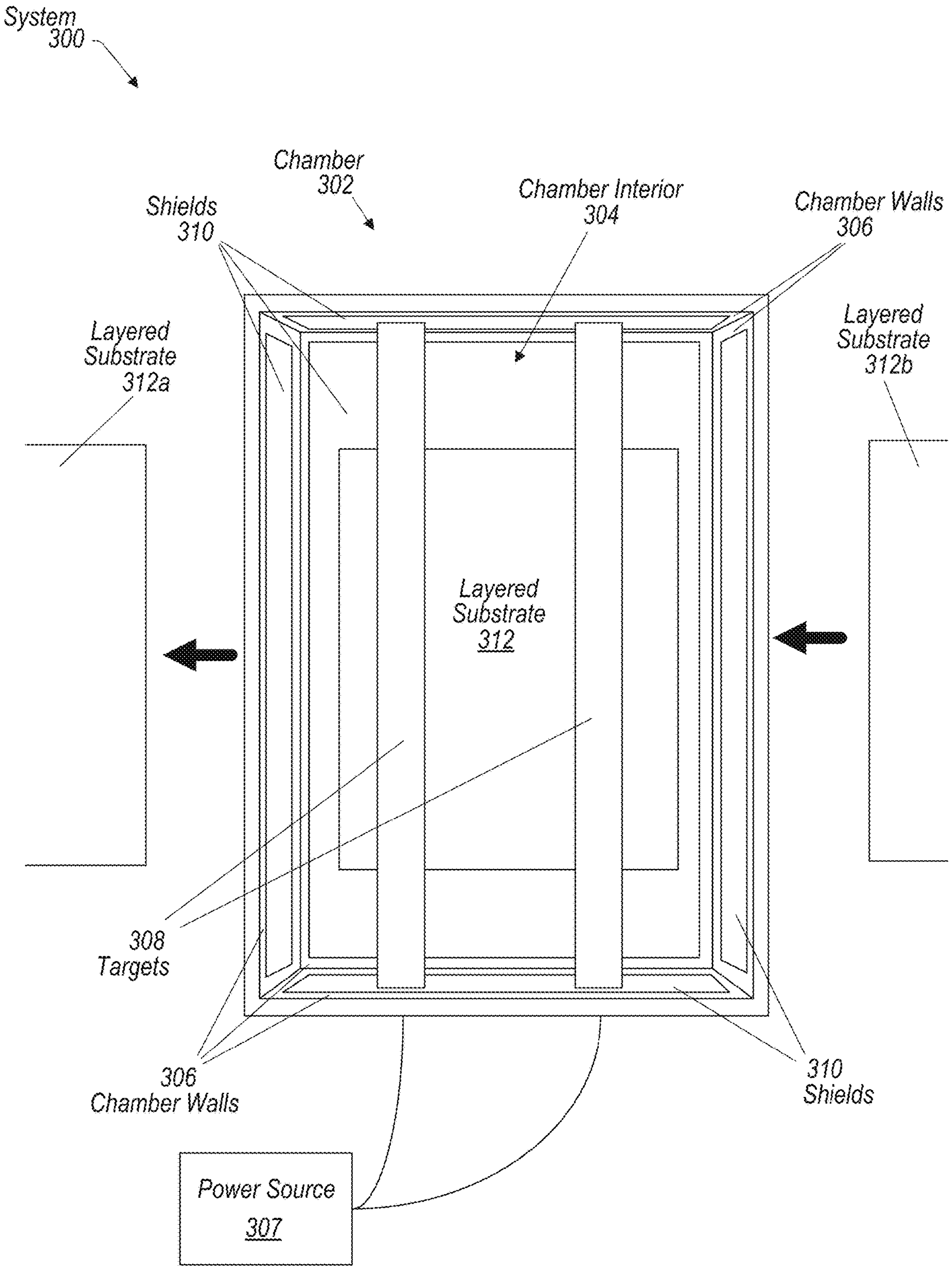
FIG. 3 illustrates a perspective view of an example manufacturing system according to some aspects of this disclosure.

FIG. 3 illustrates a perspective view of an example manufacturing system 300 according to some aspects of this disclosure. In some aspects, the manufacturing system 300 may be used to manufacture the system 100 illustrated in FIG. 1 and/or the layered substrate 512 illustrated in FIG. 5. In some aspects, the example manufacturing system 300 may implement one or more steps and/or one or more aspects of the method 200 illustrated in FIG. 2, the method 600 illustrated in FIG. 6, the method 700 illustrated in FIGS. 7A-7B, and/or the method 800 illustrated in FIGS. 8A-8B. FIG. 3, as with the other included figures, is shown for illustrative purposes and does not limit either the possible embodiments of the present invention or the claims.

As shown in FIG. 3, the manufacturing system 300 may include a chamber 302. The chamber 302 may include a chamber interior 304 formed by chamber walls 306. The chamber walls may include interior surfaces facing inward towards the chamber interior 304. One or more targets 308 (e.g., lithium (Li) targets) may be positioned within the chamber interior 304. The target(s) 308 may be powered from the power source 307. The power source 307 may include a bipolar direct current (DC) power source or supply for providing power through the Li targets to lithiate the respective at least one active layer and the respective subsequent at least one active layer. In some aspects, the power source 307 may provide an alternative current power source or supply for provide power through the Li targets to lithiate the respective at least one active layer and the respective subsequent at least one active layer.

During manufacturing of EC devices for EC systems, for example, a multitude of layered substrates (e.g., represented by layered substrates 312 and/or 312*a*) may be sequentially inserted into the chamber 304 (e.g., a vacuum chamber) for a deposition process. For example, each of the layered substrate(s) may include a plurality of layers positioned on the substrate (e.g., the substrate 110 illustrated in FIG. 1). The plurality of layers may include a first transparent conductive layer (e.g., first TC layer 124 illustrated in FIG. 1), a counter electrode (CE) layer (e.g., CE layer 128 illustrated in FIG. 1), an EC electrode layer (e.g., EC electrode layer 130 illustrated in FIG. 1), and/or a second TC layer (e.g., second TC layer 126 illustrated in FIG. 1). The target(s) 308 positioned within chamber 302 may be used, upon receiving power from the power source 307, in a deposition process for lithiating Li (e.g., sputtering Li) onto a surface of at least one layer of the layered substrate 312 and/or into at least one layer of the layered substrate 312. For example, when the target(s) receive electrical power from the power source 307, the targets may lithiate Li onto a surface of at least one active layer of the plurality of layers and/or into at least one active layer of the plurality of layers. In some aspects, an active layer may be a counter electrode (CE) layer (e.g., CE layer 128 illustrated in FIG. 1) and/or an EC electrode layer (e.g., EC electrode layer 130 illustrated in FIG. 1). In some aspects, the target(s) 308 may include at least one cylindrical target and/or at least one planar target. As described herein, lithiating Li onto a surface of at least one layer of the layered substrate and/or into at least one layer of the layered substrate may be used for changing a tint of the EC device when the EC device receives electrical power.

When the target(s) 308 lithiate Li onto and/or into at least one layer of the plurality of layers of the layered substrate 312*a* and 312, Li is also deposited, as a result of the deposition process, onto surfaces forming the interior walls 306 of the chamber 302. For example, in addition to Li depositing onto and/or into an active layer of the plurality of layers of the layered substrate 312, 312*a*, Li is also deposited onto one or more side walls forming the interior sides of the chamber 302 and/or on a top wall forming an interior ceiling of the chamber 302. As lithium builds on surfaces forming the interior walls 306 of the chamber 302, portions of that lithium can fall off (e.g., slough off, flake off) those interior surfaces and fall back on the targets 308 and/or the layered substrate 312. Portions of the lithium that fall off the interior surfaces and onto the layered substrate may contaminate the layered substrate 312 and create visual defects at the locations of the layered substrate 312 that receive those lithium portions from the interior surfaces. Also, portions of the lithium that fall off the interior surfaces of the chamber 302 and onto the target(s) 308 contaminating the target(s) may create visual defects on the layered substrate 312 when lithium from the area(s) of the target(s) 308 that received those lithium portions lithiate onto and/or into a layer of the layered substrate 312.

Accordingly, to prevent lithium from creating visual defects on the layered substrates 312 or subsequent layered substrates **312*b*, at least some lithium may be removed from the interior walls 306 of the chamber 302 to prevent portions of the lithium from falling off the interior walls 306 of the chamber 302 and onto the layered substrate 312 and/or the subsequent layered substrates 312*b* contaminating the layered substrate(s) 312, 312*b* and/or from falling off the interior walls 306 of the chamber 302 and onto the targets 308. For example, at least some lithium may be removed from the interior walls 306 of the chamber 302 after a predetermined amount of time or after a predetermined number of layered substrates 312*a* have been lithiated. The predetermined amount of time and/or the predetermined number of layered substrates 312*a* that have been lithiated may be calculated to predict a maximum or acceptable amount of lithium forming on the interior surfaces 306 of the chamber 302 without portions of lithium separating from the interior walls 306 and contaminating the layered substrate(s) 312, 312*b* and/or the target(s) 308. In some aspects, only some lithium may be removed from the interior surfaces 306 of the chamber 302 so as to prevent lithium from separating from the interior walls 306 and contaminating the layered substrate 312, 312*b* and/or the target(s) 308 for a predetermined amount of time and/or for a predetermined number of layered substrates 312*b* that have been lithiated. Removing only some of the lithium forming on the interior walls 306 of the chamber 302 may prevent contamination of the layered substrates 312, 312*b* and/or the targets 308 and prevent visual defects from forming on the layered substrates 312, 312*b* while maintaining a high EC device manufacturing rate. For example, removing only some (e.g., a predetermined adequate amount) of the lithium from the interior walls 306 of the chamber 302 may utilize a minimal amount of time to maintain a high EC device manufacturing rate. In some aspects, all or substantially all of the lithium may be removed from the interior surfaces 306 of the chamber 302 so as to prevent lithium from separating from the interior walls 308 and contaminating the layered substrates 312, 312*b* and/or the target(s) 308 for a predetermined amount of time and/or for a predetermined number of layered substrates 312*b* that have been lithiated. For example, removing all or substantially all of the lithium from the interior walls 306 of the chamber 302 may extend the amount of time or the number of layered substrates 312*b* that are lithiated before lithium from the interior walls 306 of the chamber 302 need subsequent lithium removal. Removing at least some lithium from the interior walls of the chamber may facilitate manufacturing hundreds, thousands, tens of thousands, and/or hundreds of thousands of layered substrates 312*b*** and/or EC devices so that 1.50% or less of those manufactured EC devices (e.g., none of those manufactured EC devices) include a visual defect.

Lithium may be removed from the interior walls 306 of the chamber 302 using a variety of different techniques. For example, lithium may be scraped and/or brushed off the interior walls 306 of the chamber 302 between lithiating layered substrates (e.g., after predetermined amount of lithiating time and/or after a predetermined number of layered substrates are lithiated). In some aspects, the interior walls 306 of the chamber 302 may be hosed down with water or chemicals under high pressure and/or sand blasted to remove lithium therefrom. Additionally, or alternatively, the interior walls 306 of the chamber 302 may be cleaned (e.g., using one or more chemical cleaners) to remove lithium from the interior walls 306. In some aspects, the interior walls 306 of the chamber 302 may include shields 310 positioned over the interior walls 306 of the chamber 302. The shields 310 may include one or more ridges or shelves (e.g., ridged shield 904 illustrated in FIG. 9) to catch and retain lithium thereby preventing lithium from falling off and contaminating the layered substrate 312, **312*b* and/or the target(s) 308. In some aspects, the shields 310 may include a mesh structure or textured structure (e.g., mesh shield 902 illustrated in FIG. 9) to catch and retain lithium thereon. In some aspects, the shields 310 may be removeable and reusable. For example, after the shields catch and retain lithium lithiated from the target(s) 308, the shields 310 may be removed from the chamber 308 where the lithium retained on the shields 310 is removed. Subsequently, the shields 310 may be reinserted into the chamber 302 for lithiating subsequent layered substrates 312*b*. In some aspects, the shields 310 may be removable and disposable. For example, after the shields 310 catch and retain lithium lithiated from the target(s) 308, the shields 310 may be removed from the chamber 302 and subsequently replaced with new shields for reinsertion into the chamber 302 for lithiating subsequent layered substrates 312*b***.

Additionally, or alternatively, to prevent lithium from creating visual defects the layered substrate 312 and/or subsequently layered substrates **312*b*, the power source 307 to provide power to the targets 308 may be a bi-polar direct current (DC) power source. The bi-polar DC power source may provide instant or virtually instant power switch-on/off to allow less energy to travel through an arc travelling between the target and the layered substrate and caused by a contaminated section of the target thereby reducing or minimizing visual defects forming on the layered substrate. Using, for example, a bi-polar DC power source may at least help facilitate manufacturing hundreds, thousands, tens of thousands, and/or hundreds of thousands of layered substrates and/or EC devices so that 1.50% or less of those manufactured layered substrates and/or EC devices (e.g., none of those manufactured layered substrates and/or EC devices) include a visual defect. In some aspects, the power source 307** may be an AC power source to provide fast (e.g., less fast) power switch-on/off to reduce energy travel through an arc travelling between the target and the layered substrate and caused by a contaminated section of the target thereby reducing or minimizing visual defects forming on the layered substrate. In some aspects, using, for example, an AC power source may at least help facilitate manufacturing hundreds, thousands, tens of thousands, and/or hundreds of thousands of EC devices so that 1.50% or less of those manufactured EC devices (e.g., none of those manufactured EC devices) include a visual defect.

It should be understood that the manufacturing process described herein allows for a plurality or multitude of EC devices (e.g., thousands, tens of thousands, hundreds of thousands) to be manufactured while maintaining no more than a minimal quantity of EC devices that contain a visual defect. For example, before lithium builds on surfaces forming the interior walls of the chamber so that portions of that lithium fall off (e.g., slough off, flake off) those interior surfaces and fall back on the targets and/or the layered substrate as described herein, the manufacturing process may produce no more than a minimal quantity of EC devices that include a visual defect (e.g., no more than 1.5% of those manufactured EC device have a visual defect, none of those manufactured EC device have a visual defect). Upon removing at least some of the lithium from the surface forming the interior walls of the chamber, and subsequently initiating the deposition process on the subsequent layered substrates as also described herein, the manufacturing process may continue to produce no more than the minimal quantity of EC devices that include a visual defect (e.g., no more than 1.5% of those manufactured EC device have a visual defect, none of those manufactured EC device have a visual defect). Thus, the manufacturing process avoids unwanted disruption and/or additional time and expense in manufacturing and/or the supply chain to dispose of and/or repair a larger number of EC devices that contain a visual defect as a result of lithium buildup on surfaces forming the interior of the chamber and lithium contamination of the targets and/or layered substrates.

Figure 4:
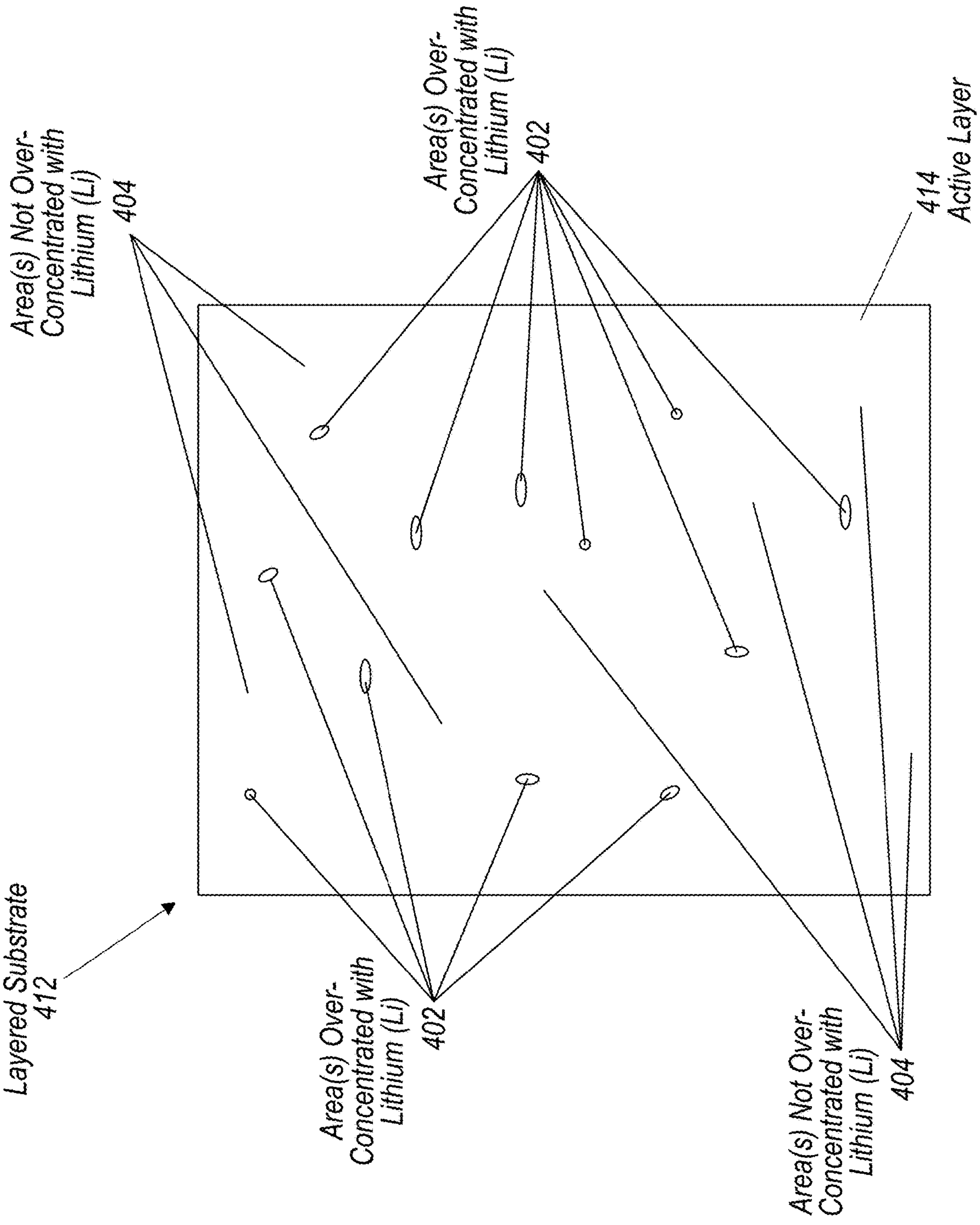
FIG. 4 illustrates a perspective view of an example layered substrate according to some aspects of this disclosure.

FIG. 4 illustrates a perspective view of an example layered substrate 412 according to some aspects of this disclosure. The layered substrate 412 may include one or more areas having visual defects and one or more remaining areas (e.g., a surrounding area) that do not include visual defects. For example, as shown in FIG. 4, the layered substrate 412 may include areas that are over-concentrated with lithium 402 into and/or across a surface of an active layer 414 and areas that are not over-concentrated with lithium 404 into and/or across a surface of the active layer 414. The layered substrate 412 may be produced when the manufacturing processes described herein are not implemented on subsequent layered substrates (e.g., layered substrates 312*b* illustrated in FIG. 3). In some aspects, the one or more remaining areas (e.g., a surrounding area) may have a lithium concentration that varies no more than about 0.1%, about 0.3%, about 0.50%, about 0.7%, about 0.9%, about 1.0%, about 2.0%, about 3.0%, about 4.0%, about 5.0%, about 6.0%, about 7.0%, about 8.0%, about 9.0%, or about 10%. In some aspects, the one or more remaining areas (e.g., a surrounding area) may have no or very little contrasting visible variance throughout, for example, in contrast to areas on the substrate over-concentrated with lithium and/or having visual defects as described herein. In some aspects, the areas on the substrate that is over-concentrated with lithium 402 may include a greater concentration of lithium relative to the at least one other remaining area (e.g., a surrounding area) on the substrate (e.g., areas that are not over-concentrated with lithium 404) by a factor of about 1.1, by a factor of about 2, by a factor of about 3, by a factor of about 4, by a factor of about 5, by a factor of about 10, by a factor of about 50, by a factor of about 100, by a factor of about 500, by a factor of about 1,000, by a factor of about 5,000, by a factor of about 10,000, by a factor of about 50,000, by a factor of about 100,000, by of a factor of about 500,000, or by of a factor of about 1,000,000.

As described herein, the one or more remaining areas, in some aspects, may include a surrounding area. For example, an area on the substrate may include a visual defect (e.g., a colored dot, a blue dot) having an over-concentration of lithium as described herein. A portion of the area with the visual defect may have one or more locations with a highest concentration of lithium relative to one or more other locations within the area having the visual defect. The one or more locations with the highest concentration of lithium may have a darker color (e.g., a darker blue color) relative to the one or more other locations within the area having visual defect. As the distance away from the one or more locations with the highest concentration of lithium increases, the lithium concentration (and/or the darker color) of the visual defect may decrease until the lithium concentration remains substantially constant and/or no defect is visible. Thus, in some aspects, a surrounding area may include an area adjacent the area having the visual defect where no defect is visible. In some aspects, a surrounding area may include an area adjacent the area having the visual defect where no or very little contrasting visible variance begins to exists and continues to exist as the distance from the highest concentration area of the visual defect continues to increase. In some aspects, a surrounding area may include an area adjacent the area having the visual defect where no or very little lithium concentration variance begins to exists and continues to exist as the distance from the highest concentration area of the visual defect continues to increase.

Figure 5:
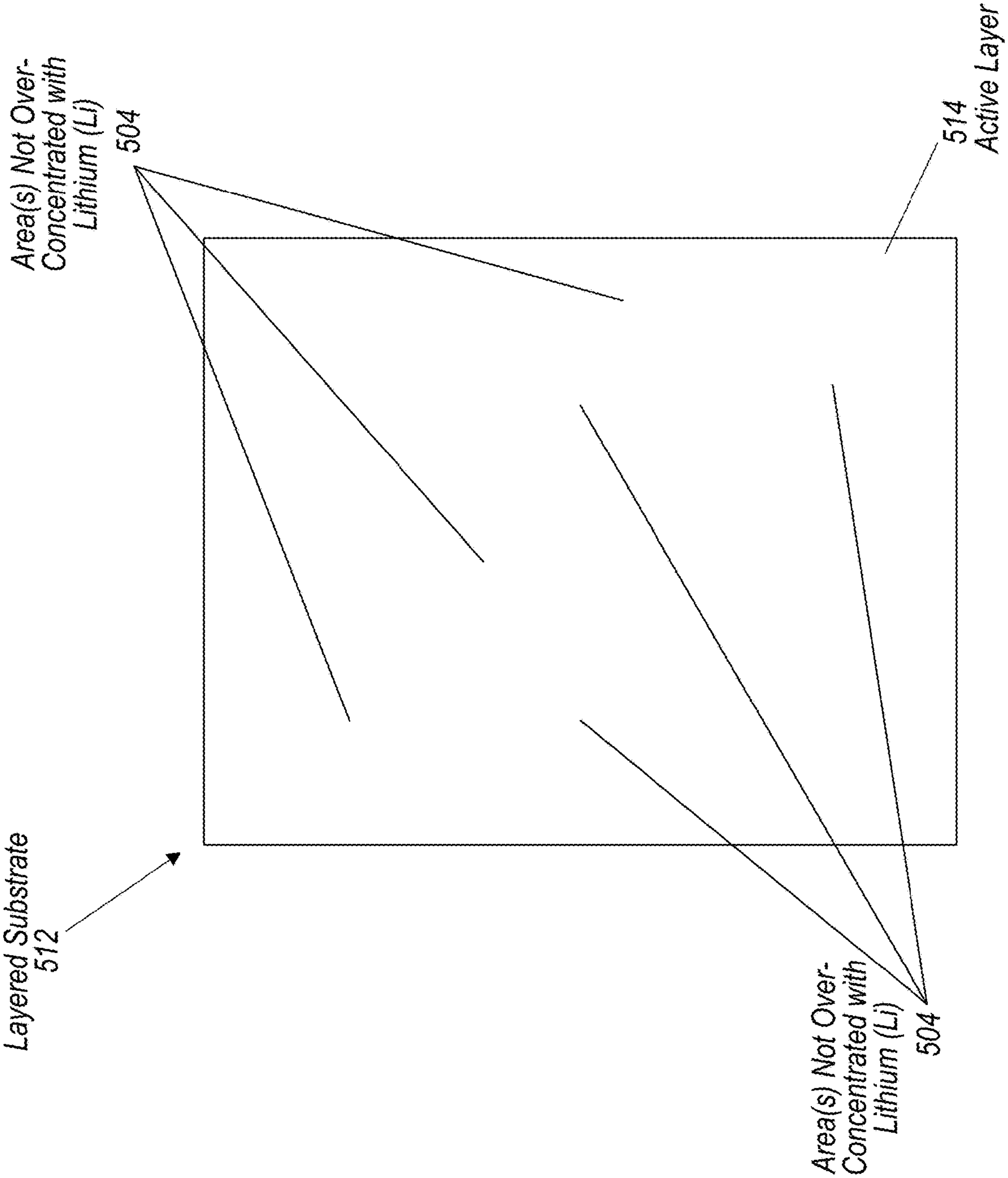
FIG. 5 illustrates a perspective view of an example layered substrate according to some aspects of this disclosure.

FIG. 5 illustrates a perspective view of an example layered substrate 512 according to some aspects of this disclosure. Unlike the layered substrate 412 illustrated in FIG. 4, the layered substrate 512 may include no areas having visual defects. For example, as shown in FIG. 5, the layered substrate 512 may include only areas that are not over-concentrated with lithium 502 into and/or across a surface of an active layer 514. The layered substrate 512 may be produced when the manufacturing processes described herein are implemented on subsequent layered substrates (e.g., layered substrates 312*b* illustrated in FIG. 3). As described herein, the manufacturing methods described herein may permit manufacturing hundreds, thousands, tens of thousands, and/or hundreds of thousands of layered substrates and/or EC devices so that 1.50% or less of those manufactured EC devices (e.g., none of those manufactured EC devices) include a visual defect. For example, the process that uses the one or more Li targets provides an over-concentrated Li deposit area that is visually identifiable relative to the at least one other remaining area (e.g., a surrounding area) on no more than 1.50% of manufactured EC devices. In some cases, the over-concentrated Li deposit area is visually identifiable relative to the at least one other remaining area (e.g., a surrounding area) by a person standing no more than five feet from the over-concentrated Li deposit area and possessing at least one of 20/20 vision or a LogMAR score of 0.0 from an early treatment diabetic retinopathy study (ETDRS). In some aspects, the Li deposit area has a surface cross-section with a lower bound that is about 2.0 microns and an upper bound that is about 3.0 millimeters (mm) on no more than 1.50% of manufactured EC devices. It should be understood that the Li deposit area may have a surface cross-section with a lower bound that is less than about 2.0 microns and an upper bound that is greater than about 3.0 mm on no more than 1.50% of manufactured EC devices without deviating from the scope of this disclosure. The cross-section spans across a plane that is parallel to a surface of at least one layer of the plurality of layers that is positioned against a surface of the substrate. In some aspects, the process that uses the one or more Li targets provides a Li deposit area on the layered substrate that is visually inconsistent relative to at least one other remaining area (e.g., a surrounding area) on the layered substrate on no more than 1.50% of manufactured EC devices. The Li deposit area that is visually inconsistent relative to the at least one other remaining area (e.g., a surrounding area) on the layered substrate is visually inconsistent when viewed by a person standing no more than five feet from the Li tungsten-oxide deposit area and possessing at least one of 20/20 vision or a LogMAR score of 0.0 from an early treatment diabetic retinopathy study (ETDRS).

Figure 6:
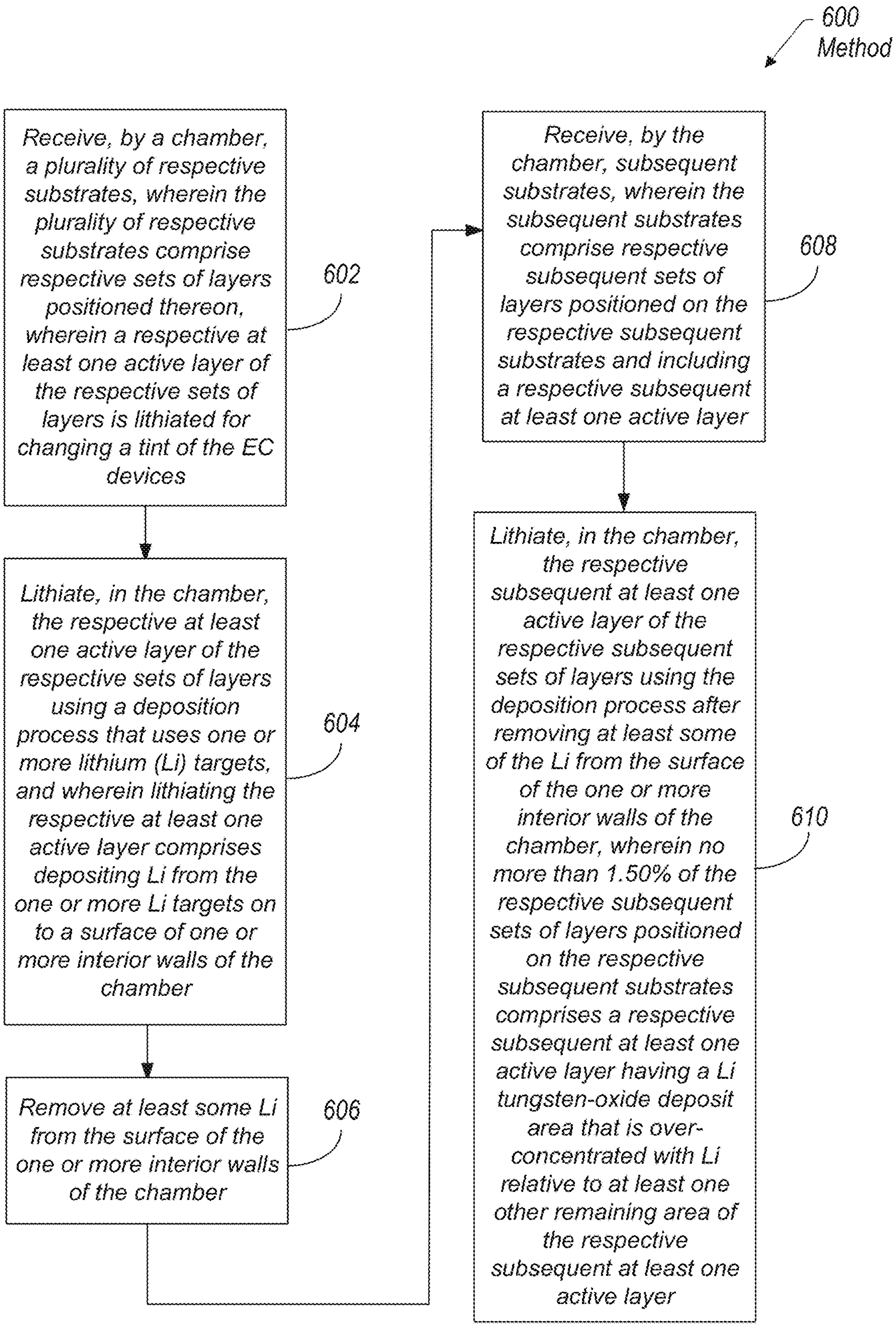
FIG. 6 illustrates a block diagram of an example method according to some aspects of this disclosure.

FIG. 6 illustrates a block diagram of an example method 600 according to some aspects of this disclosure. In some aspects, the method 600 may be implemented to manufacture the system 100 illustrated in FIG. 1 and/or the layered substrate 512 illustrated in FIG. 5. In some aspects, the method 600 may be implemented using the system 300 illustrated in FIG. 3. One or more steps and/or one or more aspects described with respect to FIG. 6 may be included with and/or include one or more steps and/or one or more aspects of the method 200 described with respect to FIG. 2, the method 700 described with respect to FIGS. 7A-7B, and/or the method 800 described with respect to FIGS. 8A-8B. FIG. 6, as with the other included figures, is shown for illustrative purposes and does not limit either the possible embodiments of the present invention or the claims.

At step 602, a chamber may receive a plurality of respective substrates. The plurality of respective substrates may include respective sets of layers positioned thereon. A respective at least one active layer of the respective sets of layers may be lithiated for changing a tint of respective EC devices. For example, during manufacturing of EC devices and/or EC systems, a multitude of layered substrates may be sequentially inserted into the chamber (e.g., a vacuum chamber) for a deposition process. Each of the layered substrate(s) may include a plurality of layers positioned on the substrate. The plurality of layers may include a first transparent conductive layer (e.g., first TC layer 124 illustrated in FIG. 1), a counter electrode (CE) layer (e.g., CE layer 128 illustrated in FIG. 1), an EC electrode layer (e.g., EC electrode layer 130 illustrated in FIG. 1), and/or a second TC layer (e.g., second TC layer 126 illustrated in FIG. 1). The target(s) positioned within chamber may be used, upon receiving power from a power source, in a deposition process for lithiating Li (e.g., sputtering Li) onto a surface of at least one layer of the layered substrate and/or into at least one layer of the layered substrate.

At step 604, the respective at least one active layer of the respective sets of layers may be lithiated in the chamber using a deposition process that uses one or more lithium (Li) targets. Lithiating the respective at least one active layer may include depositing Li from the one or more Li targets on to a surface of one or more interior walls of the chamber. For example, when the target(s) receive electrical power from the power source, the targets may lithiate Li onto a surface of at least one active layer of the plurality of layers and/or into at least one active layer of the plurality of layers. In some aspects, an active layer may be a counter electrode (CE) layer (e.g., CE layer 128 illustrated in FIG. 1) and/or an EC electrode layer (e.g., EC electrode layer 130 illustrated in FIG. 1). In some aspects, the target(s) may include at least one cylindrical target and/or at least one planar target. As described herein, lithiating Li onto a surface of at least one layer of the layered substrate and/or into at least one layer of the layered substrate may be used for changing a tint of the EC device when the EC device receives electrical power.

At step 606, at least some Li may be removed from the surface of the one or more interior walls of the chamber. For example, at least some lithium may be removed from the interior walls of the chamber after a predetermined amount of time or after a predetermined number of layered substrates have been lithiated. The predetermined amount of time and/or the predetermined number of layered substrates that have been lithiated may be calculated to predict a maximum or acceptable amount of lithium forming on the interior surfaces of the chamber without portions of lithium separating from the interior walls and contaminating the layered substrate(s) and/or the target(s). In some aspects, only some lithium may be removed from the interior surfaces of the chamber so as to prevent lithium from separating from the interior walls and contaminating the layered substrate and/or the target(s) for a predetermined amount of time and/or for a predetermined number of layered substrates that have been lithiated. Removing only some of the lithium forming on the interior walls of the chamber may prevent contamination of the layered substrates and/or the targets and prevent visual defects from forming on the layered substrates while maintaining a high EC device manufacturing rate. For example, removing only some (e.g., a predetermined adequate amount) of the lithium from the interior walls of the chamber may utilize a minimal amount of time to maintain a high EC device manufacturing rate. In some aspects, all or substantially all of the lithium may be removed from the interior surfaces of the chamber so as to prevent lithium from separating from the interior walls and contaminating the layered substrates and/or the target(s) for a predetermined amount of time and/or for a predetermined number of layered substrates that have been lithiated. For example, removing all or substantially all of the lithium from the interior walls of the chamber may extend the amount of time or the number of layered substrates that are lithiated before lithium from the interior walls of the chamber need subsequent lithium removal. Removing at least some lithium from the interior walls of the chamber may facilitate manufacturing hundreds, thousands, tens of thousands, and/or hundreds of thousands of layered substrates and/or EC devices so that 1.50% or less of those manufactured EC devices (e.g., none of those manufactured EC devices) include a visual defect.

Lithium may be removed from the interior walls of the chamber using a variety of different techniques. For example, lithium may be scraped and/or brushed off the interior walls of the chamber between lithiating layered substrates (e.g., after predetermined amount of lithiating time and/or after a predetermined number of layered substrates are lithiated). In some aspects, the interior walls of the chamber may be hosed down with water or chemicals under high pressure and/or sand blasted to remove lithium therefrom. Additionally, or alternatively, the interior walls of the chamber may be cleaned (e.g., using one or more chemical cleaners) to remove lithium from the interior walls. In some aspects, the interior walls of the chamber may include shields positioned over the interior walls of the chamber. The shields may include one or more ridges or shelves (e.g., ridged shield 904 illustrated in FIG. 9) to catch and retain lithium thereby preventing lithium from falling off and contaminating the layered substrate and/or the target(s). In some aspects, the shields may include a mesh structure or textured structure (e.g., mesh shield 902 illustrated in FIG. 9) to catch and retain lithium thereon. In some aspects, the shields may be removeable and reusable. For example, after the shields catch and retain lithium lithiated from the target(s), the shields may be removed from the chamber where the lithium retained on the shields is removed. Subsequently, the shields may be reinserted into the chamber for lithiating subsequent layered substrates. In some aspects, the shields may be removable and disposable. For example, after the shields catch and retain lithium lithiated from the target(s), the shields may be removed from the chamber and subsequently replaced with new shields for reinsertion into the chamber for lithiating subsequent layered substrates.

At step 608, subsequent substrates may be received by the chamber. The subsequent substrates may include respective subsequent sets of layers positioned on the respective subsequent substrates and including a respective subsequent at least one active layer, and at step 610, the respective subsequent at least one active layer of the respective subsequent sets of layers may be lithiated in the chamber using the deposition process after removing at least some of the Li from the surface of the one or more interior walls of the chamber. No more than 1.50% of the respective subsequent sets of layers positioned on the respective subsequent substrates comprises a respective subsequent at least one active layer having a Li deposit area that is over-concentrated with Li relative to at least one other remaining area of the respective subsequent at least one active layer. For example, after at least some lithium is removed from the interior walls of the chamber, a plurality of subsequent layered substrates may be inserted on and/or positioned into the chamber, and a deposition process may be initiated in the chamber on at least one layer of the plurality of respective subsequent layered substrates using the Li target. For example, a multitude of subsequent layered substrates may be sequentially positioned (e.g., one at a time) into the chamber. The target(s) may lithiate lithium on to each of the subsequent sequentially positioned layered substrates so that lithium collects onto a surface and/or within at least one layer of the plurality of layers of each respective layered substrates. As a result of this process, a multitude of layered substrates are produced so that no more than 1.5% of the respective subsequent layered substrates include at least one layer having a Li deposit area that is over-concentrated with Li relative to at least one other remaining area of the respective at least one layer. In some aspects, a plurality or a multitude of layered substrates may be subsequently manufactured using a manufacturing process that uses the one or more Li targets to provide a Li tungsten-oxide deposit area on the layered substrate that is visually inconsistent relative to at least one other remaining area on the layered substrate on no more than 1.50% of manufactured EC devices.

In some aspects, to prevent lithium from creating visual defects on the layered substrate, the power source (e.g., power source 307 illustrated in FIG. 3) may provide power within a specified frequency range to the targets. For example, a power source may provide power to a pair of targets including a first target and a second target. The first target may be an anode and the second target may be a cathode. The frequency of the power may produce a rate at which the first target and the second target alternatively switch between being the anode and cathode. For instance, the frequency of the power may be 1.0 kHz. Thus, the first target and the second target may alternatingly switch between being the anode and the cathode one thousand (1000) times per second. In some aspects, to prevent lithium from creating visual defects on the layered substrate, the frequency range of the power may be between about 0.5 kHz and about 10.0 kHz. In some aspects, to prevent lithium from creating visual defects on the layered substrate, the frequency range of the power may be as low as about 0.1 kHz and as high as about 20.0 kHz. In some aspects, a power source may provide power to the targets at a frequency outside the frequency range (e.g., 30.0 kHz, 35.0 kHz) for lithiating on layered substrates, for example, at step 604. In response to detecting visual defects on a layered substrate, at step 610, a frequency of the power may be changed (e.g., lowered) to a frequency within the frequency range (e.g., 1.0 kHz) to prevent more lithium from creating visual defects on subsequent layered substrates. In some aspects, to prevent lithium from creating visual defects on the layered substrate, the frequency may be changed to a frequency that is within the frequency range without using one or more of the different techniques described herein to remove lithium from chamber as described with respect to step 606. In some aspects, to prevent lithium from creating visual defects on the layered substrate, the frequency may be changed to a frequency that is within the frequency range in addition to using one or more of the different techniques described herein to remove lithium from chamber as described with respect to step 606. In some aspects, using, for example, a frequency within the range may at least help facilitate manufacturing hundreds, thousands, tens of thousands, and/or hundreds of thousands of EC devices so that 1.50% or less of those manufactured EC devices (e.g., none of those manufactured EC devices) include a visual defect.

Please note that the functional block(s) described herein are illustrated in FIG. 6 in merely one example arrangement. In other embodiments, the techniques and functionality described above may be performed using different steps in different orders or may be grouped into a different number of steps or may be performed as a single method without distinct steps.

Figure 7A:
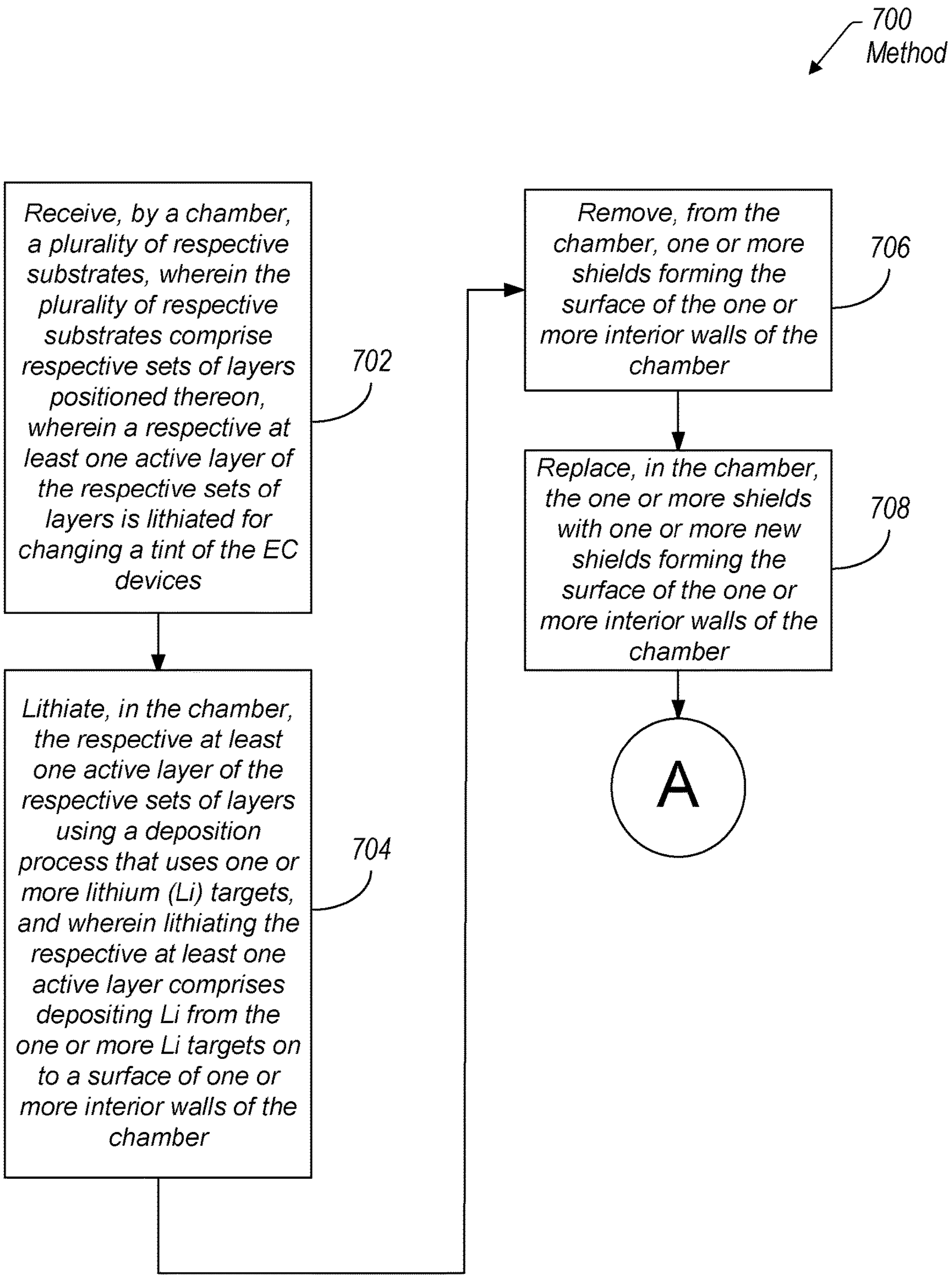
FIGS. 7A-7B illustrates a block diagram of an example method according to some aspects of this disclosure.
Figure 7B:
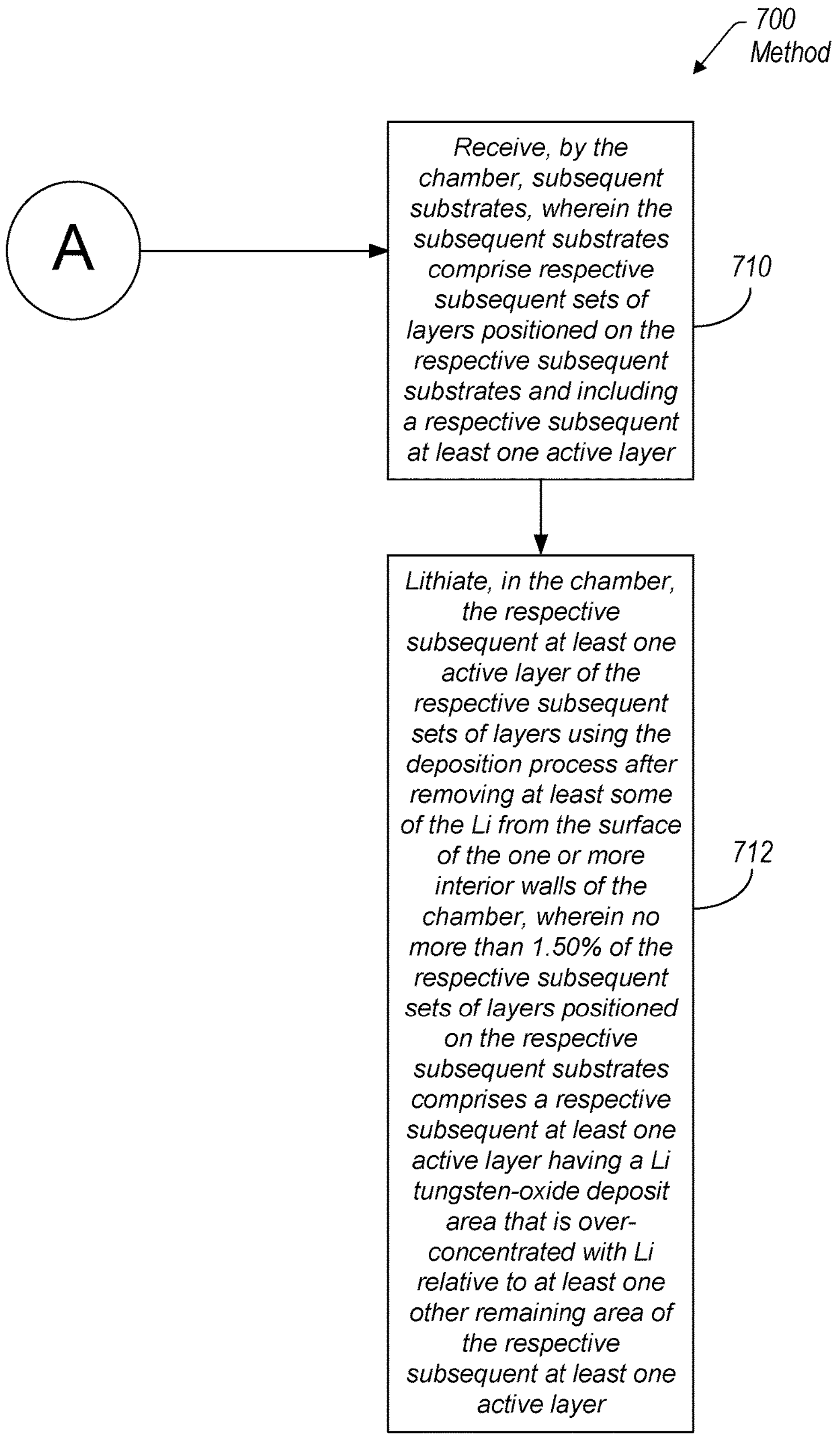

FIGS. 7A-7B illustrates a block diagram of an example method 700 according to some aspects of this disclosure. In some aspects, the method 700 may be implemented to manufacture the system 100 illustrated in FIG. 1 and/or the layered substrate 512 illustrated in FIG. 5. In some aspects, the method 700 may be implemented using the system 300 illustrated in FIG. 3. One or more steps and/or one or more aspects described with respect to FIGS. 7A-7B may be included with and/or include one or more steps and/or one or more aspects of the method 200 described with respect to FIG. 2, the method 600 described with respect to FIG. 6, and/or the method 800 described with respect to FIGS. 8A-8B. FIGS. 7A-7B, as with the other included figures, is shown for illustrative purposes and does not limit either the possible embodiments of the present invention or the claims.

At step 702, a plurality of respective substrates may be received by a chamber. The plurality of respective substrates may include respective sets of layers positioned thereon. For example, during manufacturing of EC devices and/or EC systems, a multitude of layered substrates may be sequentially inserted into the chamber (e.g., a vacuum chamber) for a deposition process. Each of the layered substrate(s) may include a plurality of layers positioned on the substrate. The plurality of layers may include a first transparent conductive layer (e.g., first TC layer 124 illustrated in FIG. 1), a counter electrode (CE) layer (e.g., CE layer 128 illustrated in FIG. 1), an EC electrode layer (e.g., EC electrode layer 130 illustrated in FIG. 1), and/or a second TC layer (e.g., second TC layer 126 illustrated in FIG. 1). The target(s) positioned within chamber may be used, upon receiving power from a power source, in a deposition process for lithiating Li (e.g., sputtering Li) onto a surface of at least one layer of the layered substrate and/or into at least one layer of the layered substrate. A respective at least one active layer of the respective sets of layers may be lithiated for changing a tint of respective EC devices.

At step 704, the respective at least one active layer of the respective sets of layers may be lithiated in the chamber using a deposition process that uses one or more lithium (Li) targets. Lithiating the respective at least one active layer may include depositing Li from the one or more Li targets on to a surface of one or more interior walls of the chamber. For example, when the target(s) receive electrical power from the power source, the targets may lithiate Li onto a surface of at least one active layer of the plurality of layers and/or into at least one active layer of the plurality of layers. In some aspects, an active layer may be a counter electrode (CE) layer (e.g., CE layer 128 illustrated in FIG. 1) and/or an EC electrode layer (e.g., EC electrode layer 130 illustrated in FIG. 1). In some aspects, the target(s) may include at least one cylindrical target and/or at least one planar target. As described herein, lithiating Li onto a surface of at least one layer of the layered substrate and/or into at least one layer of the layered substrate may be used for changing a tint of the EC device when the EC device receives electrical power.

At step 706, one or more shields (e.g., the shields 310 illustrated in FIG. 3, the ridged shield 904 illustrated in FIG. 9, the mesh shield 902 illustrated in FIG. 9) forming the surface of the one or more interior walls of the chamber may be removed from the chamber. For example, the shields positioned on the interior walls of the chamber may be removed from the interior walls of the chamber to remove lithium therefrom after a predetermined amount of time or after a predetermined number of layered substrates have been lithiated. The predetermined amount of time and/or the predetermined number of layered substrates that have been lithiated may be calculated to predict a maximum or acceptable amount of lithium forming on the shields without portions of lithium separating from the shields contaminating the layered substrate(s) and/or the target(s). In some aspects, the shields may be removed from the chamber so only some lithium may be removed from the shields so as to prevent lithium from separating from the shields on the interior walls and contaminating the layered substrate and/or the target(s) for a predetermined amount of time and/or for a predetermined number of layered substrates that have been lithiated. Removing only some of the lithium forming on the shields on the interior walls of the chamber may prevent contamination of the layered substrates and/or the targets and prevent visual defects from forming on the layered substrates while maintaining a high layered substrate and/or EC device manufacturing rate. For example, removing only some (e.g., a predetermined adequate amount) of the lithium from the shields may utilize a minimal amount of time to maintain a high layered substrate and/or EC device manufacturing rate. In some aspects, the shields may be removed from the chamber so that all or substantially all of the lithium may be removed from the shields so as to prevent lithium from separating from the shields and contaminating the layered substrates and/or the target(s) for a predetermined amount of time and/or for a predetermined number of layered substrates that have been lithiated. For example, removing all or substantially all of the lithium from the shields may extend the amount of time or the number of layered substrates that are lithiated before lithium from the shields need subsequent lithium removal. Removing the shields from the chamber so that at least some lithium may be removed from the shields may facilitate manufacturing hundreds, thousands, tens of thousands, and/or hundreds of thousands of layered substrates and/or EC devices so that 1.50% or less of those manufactured layered substrates and/or EC devices (e.g., none of those manufactured layered substrates and/or EC devices) include a visual defect.

At step 708, the one or more shields may be replaced with one or more new shields forming the surface of the one or more interior walls of the chamber. In some aspects, the shields may be removable and disposable. For example, after the shields catch and retain lithium lithiated from the target(s), the shields may be removed from the chamber and subsequently replaced with new clean shields for reinsertion into the chamber for lithiating subsequent layered substrates.

At step 710, subsequent substrates may be received by the chamber. The subsequent substrates may include respective subsequent sets of layers positioned on the respective subsequent substrates and including a respective subsequent at least one active layer, and at step 712, the respective subsequent at least one active layer of the respective subsequent sets of layers may be lithiated in the chamber using the deposition process after removing at least some of the Li from the surface of the one or more interior walls of the chamber. No more than 1.50% of the respective subsequent sets of layers positioned on the respective subsequent substrates comprises a respective subsequent at least one active layer having a Li tungsten-oxide deposit area that is over-concentrated with Li relative to at least one other remaining area of the respective subsequent at least one active layer. For example, after the one or more shields are replaced with one or more new shields, a plurality of subsequent layered substrates may be inserted on and/or positioned into the chamber, and a deposition process may be initiated in the chamber on at least one layer of the plurality of respective subsequent layered substrates using the Li target. For example, a multitude of subsequent layered substrates may be sequentially positioned (e.g., one at a time) into the chamber. The target(s) may lithiate lithium on to each of the subsequent sequentially positioned layered substrates so that lithium collects onto a surface and/or within at least one layer of the plurality of layers of each respective layered substrates. As a result of this process, a multitude of layered substrates are produced so that no more than 1.5% of the respective subsequent layered substrates include at least one layer having a Li deposit area that is over-concentrated with Li relative to at least one other remaining area of the respective at least one layer. In some aspects, a plurality or a multitude of layered substrates may be subsequently manufactured using a manufacturing process that uses the one or more Li targets to provide a Li tungsten-oxide deposit area on the layered substrate that is visually inconsistent relative to at least one other remaining area on the layered substrate on no more than 1.50% of manufactured EC devices.

In some aspects, to prevent lithium from creating visual defects on the layered substrate, the power source (e.g., power source 307 illustrated in FIG. 3) may provide power within a specified frequency range to the targets. For example, a power source may provide power to a pair of targets including a first target and a second target. The first target may be an anode and the second target may be a cathode. The frequency of the power may produce a rate at which the first target and the second target alternatively switch between being the anode and cathode. For instance, the frequency of the power may be 1.0 kHz. Thus, the first target and the second target may alternatingly switch between being the anode and the cathode one thousand (1000) times per second. In some aspects, to prevent lithium from creating visual defects on the layered substrate, the frequency range of the power may be between about 0.5 kHz and about 10.0 kHz. In some aspects, to prevent lithium from creating visual defects on the layered substrate, the frequency range of the power may be as low as about 0.1 kHz and as high as about 20.0 kHz. In some aspects, a power source may provide power to the targets at a frequency outside the frequency range (e.g., 30.0 kHz, 35.0 kHz) for lithiating on layered substrates, for example, at step 704. In response to detecting visual defects on a layered substrate, at step 712, a frequency of the power may be changed (e.g., lowered) to a frequency within the frequency range (e.g., 1.0 kHz) to prevent more lithium from creating visual defects on subsequent layered substrates. In some aspects, to prevent lithium from creating visual defects on the layered substrate, the frequency may be changed to a frequency that is within the frequency range without using one or more of the different techniques described herein to remove lithium from chamber as described with respect to steps 706 and 708. In some aspects, to prevent lithium from creating visual defects on the layered substrate, the frequency may be changed to a frequency that is within the frequency range in addition to using one or more of the different techniques described herein to remove lithium from chamber as described with respect to steps 706 and 708. In some aspects, using, for example, a frequency within the range may at least help facilitate manufacturing hundreds, thousands, tens of thousands, and/or hundreds of thousands of EC devices so that 1.50% or less of those manufactured EC devices (e.g., none of those manufactured EC devices) include a visual defect.

Please note that the functional block(s) described herein are illustrated in FIGS. 7A-7B in merely one example arrangement. In other embodiments, the techniques and functionality described above may be performed using different steps in different orders or may be grouped into a different number of steps or may be performed as a single method without distinct steps.

Figure 8A:
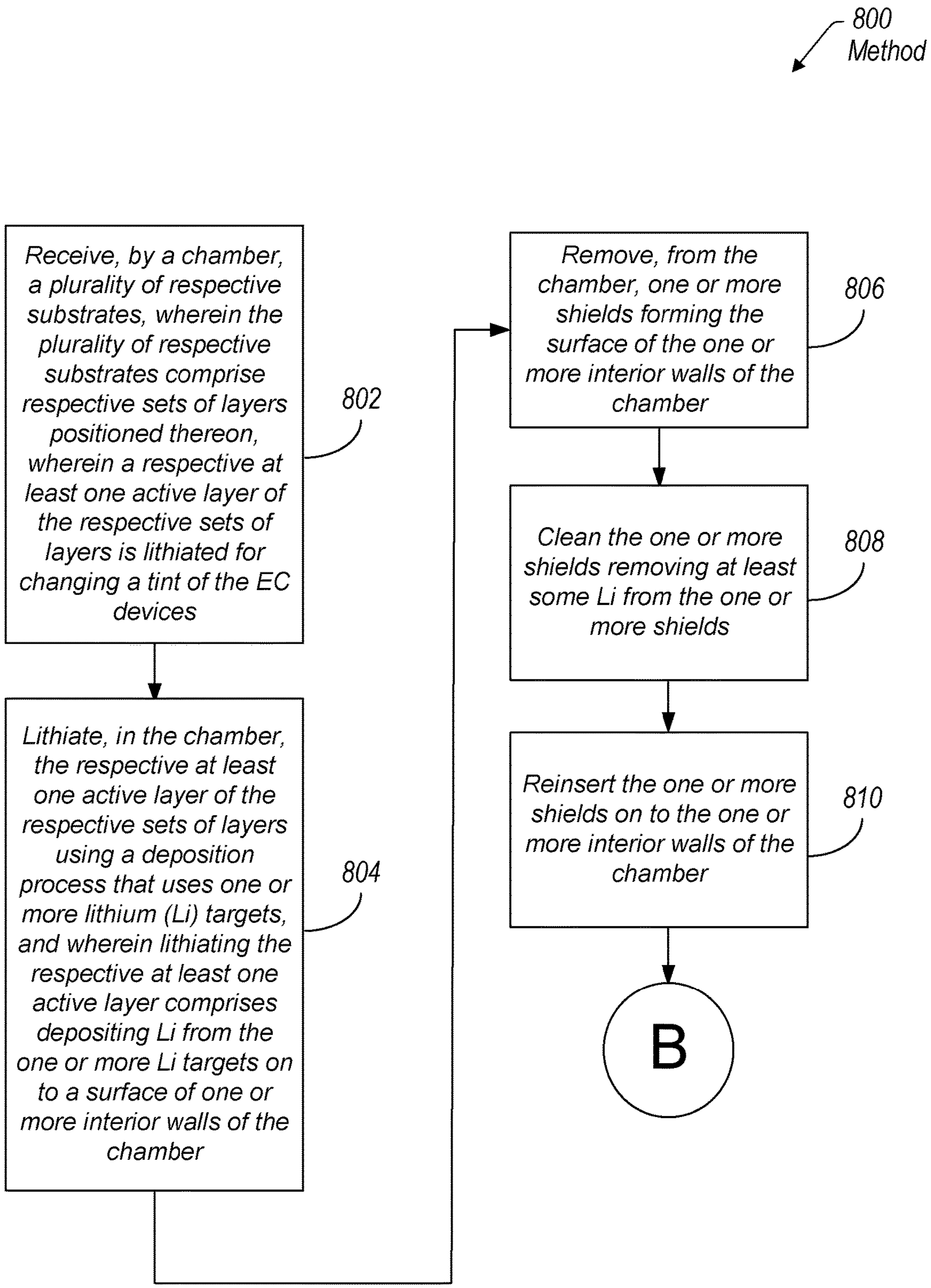
FIGS. 8A-8B illustrates a block diagram of an example method according to some aspects of this disclosure.
Figure 8B:
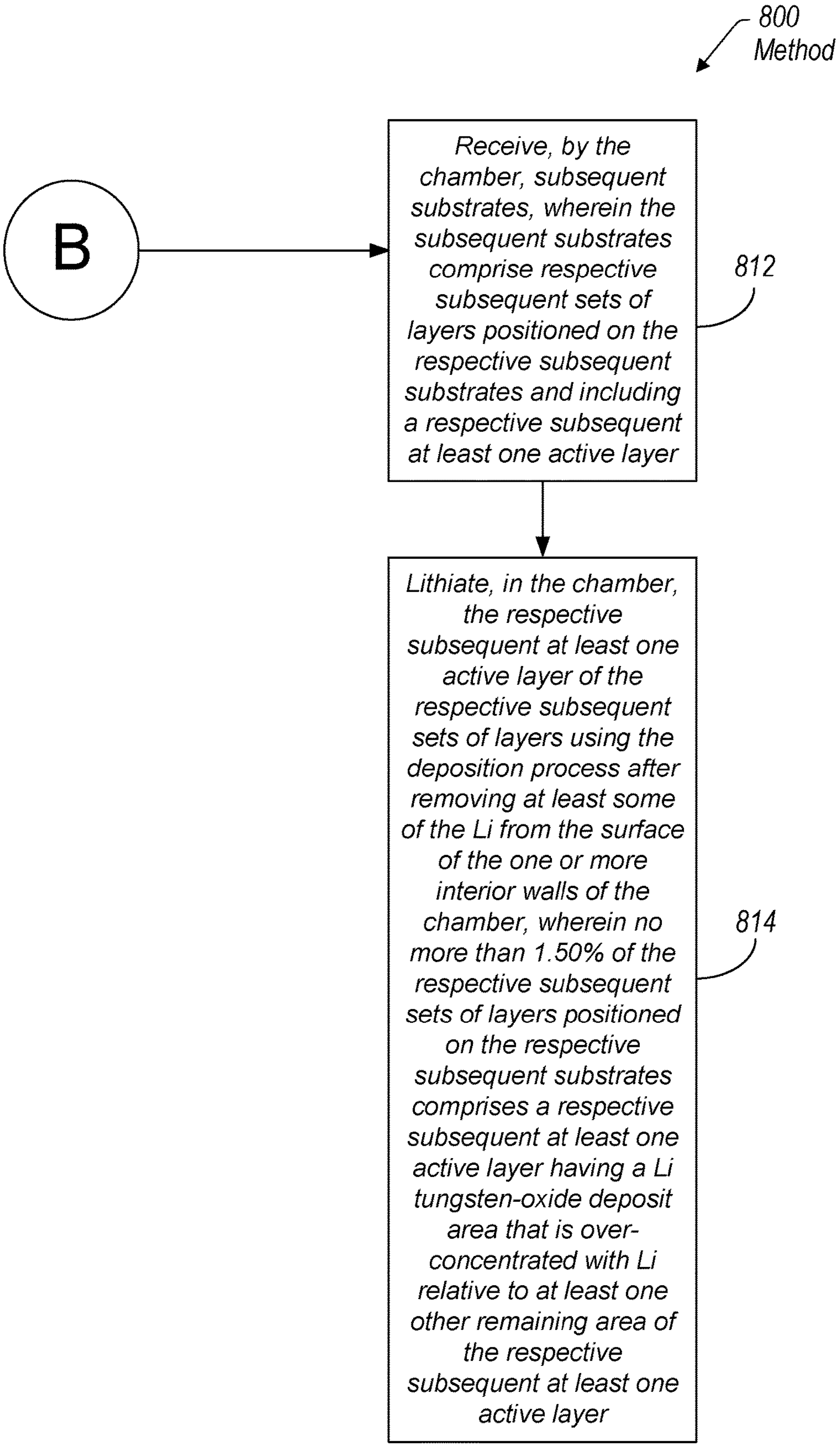

FIGS. 8A-8B illustrates a block diagram of an example method 800 according to some aspects of this disclosure. In some aspects, the method 800 may be implemented to manufacture the system 100 illustrated in FIG. 1 and/or the layered substrate 512 illustrated in FIG. 5. In some aspects, the method 800 may be implemented using the system 300 illustrated in FIG. 3. One or more steps and/or one or more aspects described with respect to FIG. 8 may be included with and/or include one or more steps and/or one or more aspects of the method 200 described with respect to FIG. 2, the method 600 described with respect to FIG. 6, and/or the method 700 described with respect to FIGS. 7A-7B. FIGS. 8A-8B, as with the other included figures, is shown for illustrative purposes and does not limit either the possible embodiments of the present invention or the claims.

At step 802, a plurality of respective substrates may be received by a chamber. The plurality of respective substrates may include respective sets of layers positioned thereon. A respective at least one active layer of the respective sets of layers may be lithiated for changing a tint of respective EC devices. For example, during manufacturing of EC devices and/or EC systems, a multitude of layered substrates may be sequentially inserted into the chamber (e.g., a vacuum chamber) for a deposition process. Each of the layered substrate(s) may include a plurality of layers positioned on the substrate. The plurality of layers may include a first transparent conductive layer (e.g., first TC layer 124 illustrated in FIG. 1), a counter electrode (CE) layer (e.g., CE layer 128 illustrated in FIG. 1), an EC electrode layer (e.g., EC electrode layer 130 illustrated in FIG. 1), and/or a second TC layer (e.g., second TC layer 126 illustrated in FIG. 1). The target(s) positioned within chamber may be used, upon receiving power from a power source, in a deposition process for lithiating Li (e.g., sputtering Li) onto a surface of at least one layer of the layered substrate and/or into at least one layer of the layered substrate. A respective at least one active layer of the respective sets of layers may be lithiated for changing a tint of respective EC devices.

At step 804, the respective at least one active layer of the respective sets of layers may be lithiated in the chamber using a deposition process that uses one or more lithium (Li) targets. Lithiating the respective at least one active layer may include depositing Li from the one or more Li targets on to a surface of one or more interior walls of the chamber. For example, when the target(s) receive electrical power from the power source, the targets may lithiate Li onto a surface of at least one active layer of the plurality of layers and/or into at least one active layer of the plurality of layers. In some aspects, an active layer may be a counter electrode (CE) layer (e.g., CE layer 128 illustrated in FIG. 1) and/or an EC electrode layer (e.g., EC electrode layer 130 illustrated in FIG. 1). In some aspects, the target(s) may include at least one cylindrical target and/or at least one planar target. As described herein, lithiating Li onto a surface of at least one layer of the layered substrate and/or into at least one layer of the layered substrate may be used for changing a tint of the EC device when the EC device receives electrical power.

At step 806, one or more shields (e.g., the shields 310 illustrated in FIG. 3, the ridged shield 904 illustrated in FIG. 9, the mesh shield 902 illustrated in FIG. 9) forming the surface of the one or more interior walls of the chamber may be removed from the chamber. For example, the shields positioned on the interior walls of the chamber may be removed from the interior walls of the chamber to remove lithium therefrom after a predetermined amount of time or after a predetermined number of layered substrates have been lithiated. The predetermined amount of time and/or the predetermined number of layered substrates that have been lithiated may be calculated to predict a maximum or acceptable amount of lithium forming on the shields without portions of lithium separating from the shields contaminating the layered substrate(s) and/or the target(s). In some aspects, the shields may be removed from the chamber so only some lithium may be removed from the shields so as to prevent lithium from separating from the shields on the interior walls and contaminating the layered substrate and/or the target(s) for a predetermined amount of time and/or for a predetermined number of layered substrates that have been lithiated. Removing only some of the lithium forming on the shields on the interior walls of the chamber may prevent contamination of the layered substrates and/or the targets and prevent visual defects from forming on the layered substrates while maintaining a high layered substrate and/or EC device manufacturing rate. For example, removing only some (e.g., a predetermined adequate amount) of the lithium from the shields may utilize a minimal amount of time to maintain a high layered substrate and/or EC device manufacturing rate. In some aspects, the shields may be removed from the chamber so that all or substantially all of the lithium may be removed from the shields so as to prevent lithium from separating from the shields and contaminating the layered substrates and/or the target(s) for a predetermined amount of time and/or for a predetermined number of layered substrates that have been lithiated. For example, removing all or substantially all of the lithium from the shields may extend the amount of time or the number of layered substrates that are lithiated before lithium from the shields need subsequent lithium removal. Removing the shields from the chamber so that at least some lithium may be removed from the shields may facilitate manufacturing hundreds, thousands, tens of thousands, and/or hundreds of thousands of layered substrates and/or EC devices so that 1.50% or less of those manufactured layered substrates and/or EC devices (e.g., none of those manufactured layered substrates and/or EC devices) include a visual defect.

At step 808, the one or more shields may be cleaned removing at least some Li from the one or more shields. For example, lithium may be scraped and/or brushed off the shields between lithiating layered substrates (e.g., after predetermined amount of lithiating time and/or after a predetermined number of layered substrates are lithiated). In some aspects, the shields may be hosed down with water or chemicals under high pressure and/or sand blasted to remove lithium therefrom. Additionally, or alternatively, the shields may be cleaned using one or more chemical cleaners to remove lithium from the interior walls.

At step 810, the one or more shields reinserted on to the one or more interior walls of the chamber. For example, the shields may be removeable and reusable. For example, after the shields catch and retain lithium lithiated from the target(s), the shields may be removed from the chamber where the lithium retained on the shields is removed. Subsequently, the shields may be reinserted into the chamber for lithiating subsequent layered substrates.

At step 812, subsequent substrates may be received by the chamber. The subsequent substrates may include respective subsequent sets of layers positioned on the respective subsequent substrates and including a respective subsequent at least one active layer, and at step 814, the respective subsequent at least one active layer of the respective subsequent sets of layers may be lithiated in the chamber using the deposition process after removing at least some of the Li from the surface of the one or more interior walls of the chamber. No more than 1.50% of the respective subsequent sets of layers positioned on the respective subsequent substrates comprises a respective subsequent at least one active layer having a Li tungsten-oxide deposit area that is over-concentrated with Li relative to at least one other remaining area of the respective subsequent at least one active layer. For example, after the one or more shields are removed from the chamber, cleaned, and reinserted into the chamber, a plurality of subsequent layered substrates may be inserted on and/or positioned into the chamber, and a deposition process may be initiated in the chamber on at least one layer of the plurality of respective subsequent layered substrates using the Li target. For example, a multitude of subsequent layered substrates may be sequentially positioned (e.g., one at a time) into the chamber. The target(s) may lithiate lithium on to each of the subsequent sequentially positioned layered substrates so that lithium collects onto a surface and/or within at least one layer of the plurality of layers of each respective layered substrates. As a result of this process, a multitude of layered substrates are produced so that no more than 1.5% of the respective subsequent layered substrates include at least one layer having a Li deposit area that is over-concentrated with Li relative to at least one other remaining area of the respective at least one layer. In some aspects, a plurality or a multitude of layered substrates may be subsequently manufactured using a manufacturing process that uses the one or more Li targets to provide a Li tungsten-oxide deposit area on the layered substrate that is visually inconsistent relative to at least one other remaining area on the layered substrate on no more than 1.50% of manufactured EC devices.

In some aspects, to prevent lithium from creating visual defects on the layered substrate, the power source (e.g., power source 307 illustrated in FIG. 3) may provide power within a specificd frequency range to the targets. For example, a power source may provide power to a pair of targets including a first target and a second target. The first target may be an anode and the second target may be a cathode. The frequency of the power may produce a rate at which the first target and the second target alternatively switch between being the anode and cathode. For instance, the frequency of the power may be 1.0 kHz. Thus, the first target and the second target may alternatingly switch between being the anode and the cathode one thousand (1000) times per second. In some aspects, to prevent lithium from creating visual defects on the layered substrate, the frequency range of the power may be between about 0.5 kHz and about 10.0 kHz. In some aspects, to prevent lithium from creating visual defects on the layered substrate, the frequency range of the power may be as low as about 0.1 kHz and as high as about 20.0 kHz. In some aspects, a power source may provide power to the targets at a frequency outside the frequency range (e.g., 30.0 kHz, 35.0 kHz) for lithiating on layered substrates, for example, at step 804. In response to detecting visual defects on a layered substrate, at step 814, a frequency of the power may be changed (e.g., lowered) to a frequency within the frequency range (e.g., 1.0 kHz) to prevent more lithium from creating visual defects on subsequent layered substrates. In some aspects, to prevent lithium from creating visual defects on the layered substrate, the frequency may be changed to a frequency that is within the frequency range without using one or more of the different techniques described herein to remove lithium from chamber as described with respect to steps 806, 808, and 810. In some aspects, to prevent lithium from creating visual defects on the layered substrate, the frequency may be changed to a frequency that is within the frequency range in addition to using one or more of the different techniques described herein to remove lithium from chamber as described with respect to steps 806, 808, and 810. In some aspects, using, for example, a frequency within the range may at least help facilitate manufacturing hundreds, thousands, tens of thousands, and/or hundreds of thousands of EC devices so that 1.50% or less of those manufactured EC devices (e.g., none of those manufactured EC devices) include a visual defect.

Please note that the functional block(s) described herein are illustrated in FIGS. 8A-8B in merely one example arrangement. In other embodiments, the techniques and functionality described above may be performed using different steps in different orders or may be grouped into a different number of steps or may be performed as a single method without distinct steps.

Figure 9:
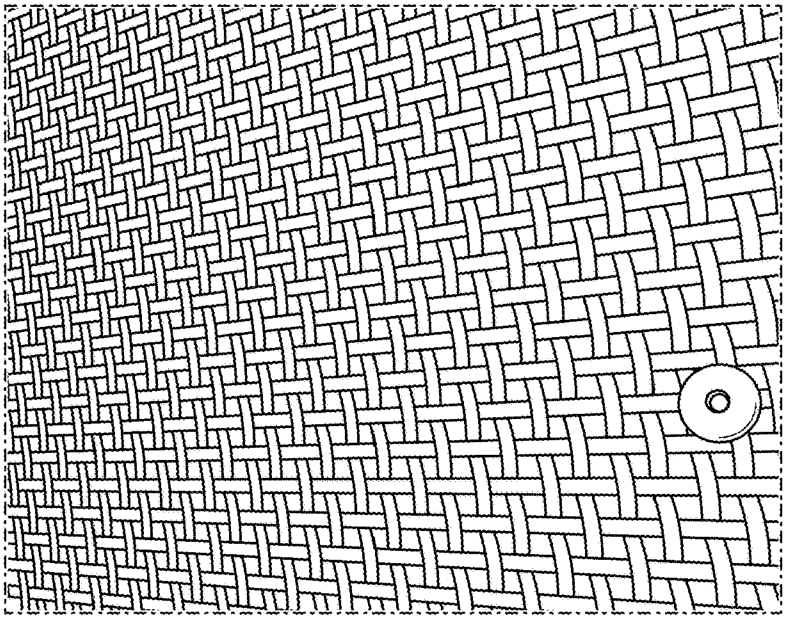
FIG. 9 illustrates perspective views of example shields according to some aspects of this disclosure.
Figure 9:
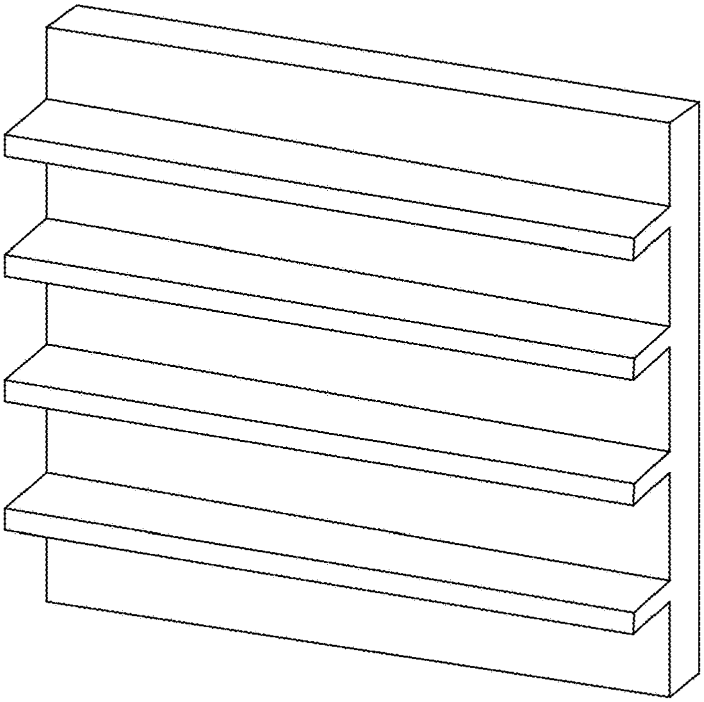

FIG. 9 illustrates perspective views of example shields according to some aspects of this disclosure. As shown in FIG. 9, a mesh shield 902 may be used to capture and retain lithium during a lithiation process as described herein. Lithium may accumulate and be retained between the threads of the mesh to prevent at least some lithium from falling off the mesh shield 902 and onto the layered substrate contaminating the layered substrate and/or from falling off the mesh shield 902 and onto the targets contaminating the targets. The mesh shield 902 may be permanently fixed on the interior walls of a chamber or may be removable from interior walls of a chamber. In some aspects, the mesh shield 902 may be cleaned removing at least some Li from the mesh shield 902. For example, lithium may be scraped and/or brushed off the mesh shield 902 between lithiating layered substrates (e.g., after predetermined amount of lithiating time and/or after a predetermined number of layered substrates are lithiated). In some aspects, the mesh shield 902 may be hosed down with water or chemicals under high pressure and/or sand blasted to remove lithium therefrom.

Additionally, or alternatively, the mesh shield 902 may be cleaned using one or more chemical cleaners to remove lithium therefrom.

As also shown in FIG. 9, a ridged shield 904 may be used to capture and retain lithium during a lithiation process as described herein. Lithium may accumulate and be retained on the ridges of the ridged shield 904 to prevent at least some lithium from falling off the ridged shield 904 and onto the layered substrate contaminating the layered substrate and/or from falling off the ridged shield 904 and onto the targets contaminating the targets. The ridged shield 904 may be permanently fixed on the interior walls of a chamber or may be removable from interior walls of a chamber. In some aspects, the ridged shield 904 may be cleaned removing at least some Li from the ridged shield 904. For example, lithium may be scraped and/or brushed off the ridged shield 904 between lithiating layered substrates (e.g., after predetermined amount of lithiating time and/or after a predetermined number of layered substrates are lithiated). In some aspects, the ridged shield 904 may be hosed down with water or chemicals under high pressure and/or sand blasted to remove lithium therefrom. Additionally, or alternatively, the ridged shield 904 may be cleaned using one or more chemical cleaners to remove lithium therefrom.

In some aspects, an electrochromic (EC) device is provided. The EC device may include a substrate and a plurality of layers formed on the substrate. At least one active layer of the plurality of layers may be lithiated for changing a tint of the EC device. The at least one active layer may be lithiated using a deposition process that uses one or more lithium (Li) targets. The deposition process may provide, on no more than 1.5% of manufactured EC devices, a Li tungsten-oxide deposit area on the substrate that is over-concentrated with Li relative to a surrounding area on the substrate.

In some aspects, the Li tungsten-oxide deposit area on the substrate that may be over-concentrated with Li comprises a greater concentration of Li relative to the at least one other remaining area on the substrate by a factor of about 1.1, by a factor of about 2, by a factor of about 3, by a factor of about 4, by a factor of about 5, by a factor of about 10, by a factor of about 50, by a factor of about 100, by a factor of about 500, by a factor of about 1,000, by a factor of about 5,000, by a factor of about 10,000, by a factor of about 50,000, by a factor of about 100,000, by of a factor of about 500,000, or by of a factor of about 1,000,000. In some aspects, the plurality of layers may include a first transparent conductive (TC) layer, a counter electrode (CE) layer, an EC electrode layer, and a second TC layer. In some aspects, the at least one active layer of the plurality of layers may include at least one of a counter electrode (CE) layer or an EC electrode layer. In some aspects, the deposition process that uses the one or more Li targets may provide an over-concentrated Li tungsten-oxide deposit area that is visually identifiable relative to the at least one other remaining area on no more than 1.50% of manufactured EC devices.

An electrochromic (EC) system is provided. The EC system may include a substrate and a plurality of layers on the substrate. The EC system may also include a power supply electrically connected to the EC device and configured to provide a voltage to the EC device for controlling a tint of the EC device. The at least one active layer of the plurality of layers may be lithiated for changing a tint of the EC device. The at least one active layer may be lithiated using a deposition process that uses one or more lithium (Li) targets. The deposition process that uses the one or more Li targets may provide a Li tungsten-oxide deposit area on the substrate that is over-concentrated with Li relative to at least one other remaining area on the substrate and on no more than 1.50% of manufactured EC devices.

In some aspects, the over-concentrated Li tungsten-oxide deposit area may be visually identifiable relative to the at least one other remaining area by a person standing no more than five feet from the over-concentrated Li tungsten-oxide deposit area and possessing at least one of 20/20 vision or a LogMAR score of 0.0 from an early treatment diabetic retinopathy study (ETDRS). In some aspects, the deposition process may include supplying power from a bipolar direct current (DC) power supply through the one or more Li targets to lithiate into the at least one active layer of the plurality of layers on the substrate. In some aspects, the deposition process may include sputtering Li into the at least one active layer of the plurality of layers while housing the plurality of layers, the substrate, and the one or more Li targets within a chamber. The Li deposited on surfaces of one or more interior walls of the chamber may be at least partially removed from the surface of the one or more interior walls of the chamber before the deposition process begins. In some aspects, the Li tungsten-oxide deposit area may have a cross-section that is greater than 2 microns and less than 3.0 millimeters (mm) on no more than 1.50% of manufactured EC devices. The cross-section may span across a plane that is parallel to a surface of at least one layer of the plurality of layers that is positioned against a surface of the substrate.

A method of manufacturing a layered substrate for electrochromic (EC) devices is provided. The method may include receiving, by a chamber, a plurality of respective substrates. The plurality of respective substrates may include respective sets of layers positioned thereon. A respective at least one active layer of the respective sets of layers may be lithiated for changing a tint of the EC devices. The method may also include lithiating, in the chamber, the respective at least one active layer of the respective sets of layers using a deposition process that uses one or more lithium (Li) targets. Lithiating the respective at least one active layer may include depositing Li from the one or more Li targets on to a surface of one or more interior walls of the chamber. The method may further include removing at least some Li from the surface of the one or more interior walls of the chamber. In addition, the method may include receiving, by the chamber, subsequent substrates. The subsequent substrates may include respective subsequent sets of layers positioned on the respective subsequent substrates and including a respective subsequent at least one active layer. The method may include lithiating, in the chamber, the respective subsequent at least one active layer of the respective subsequent sets of layers using the deposition process after removing at least some of the Li from the surface of the one or more interior walls of the chamber. No more than 1.50% of the respective subsequent sets of layers positioned on the respective subsequent substrates may include a respective subsequent at least one active layer having a Li tungsten-oxide deposit area that is over-concentrated with Li relative to a surrounding area of the respective subsequent at least one active layer.

In some aspects, no more than 1.50% of the plurality of respective substrates may include a respective at least one active layer having a Li tungsten-oxide deposit area that is over-concentrated with Li relative to a surrounding area of the respective at least one active layer. In some aspects, lithiating, in the chamber, the respective at least one active layer of the respective sets of layers may include providing power for lithiating at a frequency outside a frequency range that is between about 0.5 kHz and about 10.0 kHz. Lithiating, in the chamber, the respective subsequent at least one active layer of the respective subsequent sets of layers may include providing power for lithiating at a frequency within the frequency range. In some aspects, removing at least some Li from the surface of the one or more interior walls of the chamber may include cleaning the surface of the one or more interior walls of the chamber. In some aspects, cleaning the surface of the one or more interior walls of the chamber may include sand blasting the surface of the one or more interior walls of the chamber. In some aspects, removing at least some Li from the surface of the one or more interior walls of the chamber may include removing one or more shields forming the surface of the one or more interior walls of the chamber. In some aspects, removing at least some Li from the surface of the one or more interior walls of the chamber may include removing the one or more shields forming the surface of the one or more interior walls of the chamber, and replacing the one or more shields with one or more new shields forming the surface of the one or more interior walls of the chamber. In some aspects, removing at least some Li from the surface of the one or more interior walls of the chamber may include removing the one or more shields forming the surface of the one or more interior walls of the chamber, cleaning the one or more shields forming the surface of the one or more interior walls of the chamber, and reinserting the one or more shields into the chamber so that the one or more shields form the surface of the one or more interior walls of the chamber. In some aspects, cleaning the one or more shields forming the surface of the one or more interior walls of the chamber may include sand blasting the one or more shields forming the surface of the one or more interior walls of the chamber. In some aspects, the one or more shields may include at least one of one or more mesh shields or one or more ridged shields. In some aspects, removing at least some Li from the surface of the one or more interior walls of the chamber may be based on an amount of time that the surface of the one or more interior walls receives Li. In some aspects, removing at least some Li from the surface of the one or more interior walls of the chamber may be based on an amount of Li that has accumulated on the surface of the one or more interior walls of the chamber.

A plurality of electrochromic (EC) devices manufactured using a lithium deposition process to reduce over-concentration deposit areas is provided. Each EC device may include a substrate and a plurality of layers formed on the substrate. At least one active layer of the plurality of layers may be lithiated for changing a tint of the EC device. The at least one active layer may be lithiated using a deposition process that uses one or more lithium (Li) targets. The deposition process may provide, on no more than 1.5% of manufactured EC devices, a Li tungsten-oxide deposit area on the substrate that is over-concentrated with Li relative to a surrounding area on the substrate.

A plurality of electrochromic (EC) devices, of a quantity no less than one-thousand, manufactured using a lithium deposition process to reduce over-concentration deposit areas is provided. Each EC device may include a substrate and a plurality of layers formed on the substrate. At least one active layer of the plurality of layers may be lithiated for changing a tint of the EC device. The at least one active layer may be lithiated using a deposition process that uses one or more lithium (Li) targets. The deposition process may provide, on no more than 1.5% of manufactured EC devices, a Li tungsten-oxide deposit area on the substrate that is over-concentrated with Li relative to a surrounding area on the substrate.

In some aspects, the Li tungsten-oxide deposit area on the substrate that is over-concentrated with Li may include a greater concentration of Li relative to the at least one other remaining area on the substrate by a factor of about 1.1, by a factor of about 2, by a factor of about 3, by a factor of about 4, by a factor of about 5, by a factor of about 10, by a factor of about 50, by a factor of about 100, by a factor of about 500, by a factor of about 1,000, by a factor of about 5,000, by a factor of about 10,000, by a factor of about 50,000, by a factor of about 100,000, by of a factor of about 500,000, or by of a factor of about 1,000,000. In some aspects, the plurality of layers may include a first transparent conductive (TC) layer, a counter electrode (CE) layer, an EC electrode layer, and a second TC layer. In some aspects, the at least one active layer of the plurality of layers may include at least one of a counter electrode (CE) layer or an EC electrode layer. In some aspects, the deposition process that uses the one or more Li targets may provide an over-concentrated Li tungsten-oxide deposit area that is visually identifiable relative to the at least one other remaining area on no more than 1.50% of manufactured EC devices.

The various methods as illustrated in the figures and described herein represent example embodiments of methods. The methods may be implemented manually, in software, in hardware, or in a combination thereof. The order of any method may be changed, and various elements may be added, reordered, combined, omitted, modified, etc.

Although the embodiments above have been described in considerable detail, numerous variations and modifications may be made as would become apparent to those skilled in the art once the above disclosure is fully appreciated. It is intended that the following claims be interpreted to embrace all such modifications and changes and, accordingly, the above description to be regarded in an illustrative rather than a restrictive sense.

What is claimed is:

1. An electrochromic (EC) device, comprising:

a substrate; and a plurality of layers formed on the substrate, wherein at least one active layer of the plurality of layers is lithiated for changing a tint of the EC device, wherein the at least one active layer is lithiated using a deposition process that uses one or more lithium (Li) targets, wherein the deposition process provides, on no more than 1.5% of manufactured EC devices, a Li tungsten-oxide deposit area on the substrate that is over-concentrated with Li relative to a surrounding area on the substrate.

2. The EC device of claim 1, wherein the Li tungsten-oxide deposit area on the substrate that is over-concentrated with Li comprises a greater concentration of Li relative to the at least one other remaining area on the substrate by a factor of about 1.1, by a factor of about 2, by a factor of about 3, by a factor of about 4, by a factor of about 5, by a factor of about 10, by a factor of about 50, by a factor of about 100, by a factor of about 500, by a factor of about 1,000, by a factor of about 5,000, by a factor of about 10,000, by a factor of about 50,000, by a factor of about 100,000, by of a factor of about 500,000, or by of a factor of about 1,000,000.

3. The EC device of claim 1, wherein the plurality of layers comprises:

a first transparent conductive (TC) layer;

a counter electrode (CE) layer;

an EC electrode layer; and a second TC layer.

4. The EC device of claim 1, wherein the at least one active layer of the plurality of layers comprises at least one of a counter electrode (CE) layer or an EC electrode layer.

5. The EC device of claim 1, wherein the deposition process that uses the one or more Li targets provides an over-concentrated Li tungsten-oxide deposit area that is visually identifiable relative to the at least one other remaining area on no more than 1.50% of manufactured EC devices.

6. An electrochromic (EC) system, comprising:

an EC device comprising a substrate and a plurality of layers on the substrate; and a power supply electrically connected to the EC device and configured to provide a voltage to the EC device for controlling a tint of the EC device, wherein at least one active layer of the plurality of layers is lithiated for changing a tint of the EC device, wherein the at least one active layer is lithiated using a deposition process that uses one or more lithium (Li) targets, wherein the deposition process that uses the one or more Li targets provides a Li tungsten-oxide deposit area on the substrate that is over-concentrated with Li relative to at least one other remaining area on the substrate and on no more than 1.50% of manufactured EC devices.

7. The EC system of claim 6, wherein the over-concentrated Li tungsten-oxide deposit area is visually identifiable relative to the at least one other remaining area by a person standing no more than five feet from the over-concentrated Li tungsten-oxide deposit area and possessing at least one of 20/20 vision or a Logar score of 0.0 from an early treatment diabetic retinopathy study (ETDRS).

8. The EC system of claim 6, wherein the deposition process comprises supplying power from a bipolar direct current (DC) power supply through the one or more Li targets to lithiate into the at least one active layer of the plurality of layers on the substrate.

9. The EC system of claim 6, wherein the deposition process comprises sputtering Li into the at least one active layer of the plurality of layers while housing the plurality of layers, the substrate, and the one or more Li targets within a chamber, and wherein the Li deposited on surfaces of one or more interior walls of the chamber is at least partially removed from the surface of the one or more interior walls of the chamber before the deposition process begins.

10. The EC system of claim 6, wherein the Li tungsten-oxide deposit area has a cross-section that is greater than 2 microns and less than 3.0 millimeters (mm) on no more than 1.50% of manufactured EC devices, and wherein the cross-section spans across a plane that is parallel to a surface of at least one layer of the plurality of layers that is positioned against a surface of the substrate.

11. A method of manufacturing a layered substrate for electrochromic (EC) devices, the method comprising:

receiving, by a chamber, a plurality of respective substrates, wherein the plurality of respective substrates comprise respective sets of layers positioned thereon, wherein a respective at least one active layer of the respective sets of layers is lithiated for changing a tint of the EC devices;

lithiating, in the chamber, the respective at least one active layer of the respective sets of layers using a deposition process that uses one or more lithium (Li) targets, and wherein lithiating the respective at least one active layer comprises depositing Li from the one or more Li targets on to a surface of one or more interior walls of the chamber;

removing at least some Li from the surface of the one or more interior walls of the chamber;

receiving, by the chamber, subsequent substrates, wherein the subsequent substrates comprise respective subsequent sets of layers positioned on the respective subsequent substrates and including a respective subsequent at least one active layer; and lithiating, in the chamber, the respective subsequent at least one active layer of the respective subsequent sets of layers using the deposition process after removing at least some of the Li from the surface of the one or more interior walls of the chamber, wherein no more than 1.50% of the respective subsequent sets of layers positioned on the respective subsequent substrates comprises a respective subsequent at least one active layer having a Li tungsten-oxide deposit area that is over-concentrated with Li relative to a surrounding area of the respective subsequent at least one active layer.

12. The method of claim 11, wherein no more than 1.50% of the plurality of respective substrates comprise a respective at least one active layer having a Li tungsten-oxide deposit area that is over-concentrated with Li relative to a surrounding area of the respective at least one active layer.

13. The method of claim 11, wherein lithiating, in the chamber, the respective at least one active layer of the respective sets of layers comprises providing power for lithiating at a frequency outside a frequency range that is between about 0.5 kHz and about 10.0 kHz, and wherein lithiating, in the chamber, the respective subsequent at least one active layer of the respective subsequent sets of layers comprises providing power for lithiating at a frequency within the frequency range.

14. The method of claim 11, wherein removing at least some Li from the surface of the one or more interior walls of the chamber comprise cleaning the surface of the one or more interior walls of the chamber.

15. The method of claim 14, wherein cleaning the surface of the one or more interior walls of the chamber comprises sand blasting the surface of the one or more interior walls of the chamber.

16. The method of claim 14, wherein removing at least some Li from the surface of the one or more interior walls of the chamber comprises removing one or more shields forming the surface of the one or more interior walls of the chamber.

17. The method of claim 16, wherein removing at least some Li from the surface of the one or more interior walls of the chamber comprises:

removing the one or more shields forming the surface of the one or more interior walls of the chamber; and replacing the one or more shields with one or more new shields forming the surface of the one or more interior walls of the chamber.

18. The method of claim 16, wherein removing at least some Li from the surface of the one or more interior walls of the chamber comprises:

removing the one or more shields forming the surface of the one or more interior walls of the chamber;

cleaning the one or more shields forming the surface of the one or more interior walls of the chamber; and reinserting the one or more shields into the chamber so that the one or more shields form the surface of the one or more interior walls of the chamber.

19. The method of claim 18, wherein cleaning the one or more shields forming the surface of the one or more interior walls of the chamber comprises sand blasting the one or more shields forming the surface of the one or more interior walls of the chamber.

20. The method of claim 16, wherein the one or more shields comprises at least one of one or more mesh shields or one or more ridged shields.

* * * * *